US012670957B2

(12) United States Patent (10) Patent No.: US 12,670,957 B2

Maejima (45) Date of Patent: Jun. 30, 2026

(54) SEMICONDUCTOR MEMORY DEVICE

(71) Applicant: Kioxia Corporation, Tokyo (JP)

(72) Inventor: Hiroshi Maejima, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/631,556

(22) Filed: Apr. 10, 2024

(65) Prior Publication Data

US 2024/0257876 A1    Aug. 1, 2024

Related U.S. Application Data

(63) Continuation of application No. 17/841,362, filed on Jun. 15, 2022, now Pat. No. 11,967,380.

(30) Foreign Application Priority Data

Nov. 15, 2021    (JP) ................................. 2021-185721

(51) Int. Cl.

| | |
|---|---|
| *G11C 16/16* | (2006.01) |
| *G11C 16/04* | (2006.01) |
| *G11C 16/08* | (2006.01) |
| *G11C 16/10* | (2006.01) |
| *G11C 16/26* | (2006.01) |

(52) U.S. Cl.

CPC .......... *G11C 16/0483* (2013.01); *G11C 16/08* (2013.01); *G11C 16/10* (2013.01); *G11C 16/26* (2013.01); *G11C 16/16* (2013.01)

(58) Field of Classification Search

CPC ...................................................... G11C 16/16

See application file for complete search history.

(56) References Cited

U.S. PATENT DOCUMENTS

| | | | |
|---|---|---|---|
| 10,074,667 | B1 | 9/2018 | Higashi et al. |
| 10,651,153 | B2 | 5/2020 | Fastow et al. |
| 10,998,301 | B2 | 5/2021 | Kanamori et al. |
| 2007/0195610 | A1* | 8/2007 | Park ...................... G11C 16/16 365/185.29 |
| 2017/0098596 | A1 | 4/2017 | Lin et al. |
| 2019/0088676 | A1 | 3/2019 | Tagami et al. |
| 2019/0206480 | A1 | 7/2019 | Robbs et al. |

FOREIGN PATENT DOCUMENTS

| | | |
|---|---|---|
| JP | 2018152419 A | 9/2018 |
| JP | 2019057532 A | 4/2019 |

* cited by examiner

*Primary Examiner* — Jason Lappas

(74) *Attorney, Agent, or Firm* — Holtz, Holtz & Volek PC

(57) ABSTRACT

According to one embodiment, a semiconductor memory device includes: a first memory cell array; a second memory cell array arranged above the first memory cell array; a third memory cell array arranged adjacent to the first memory cell array; a fourth memory cell array arranged above the third memory cell array and arranged adjacent to the second memory cell array; a first word line coupled to the first memory cell array and the second memory cell array; a second word line coupled to the third memory cell array and the fourth memory cell array; a first bit line coupled to the first memory cell array and the fourth memory cell array; and a second bit line coupled to the second memory cell array and the third memory cell array.

20 Claims, 18 Drawing Sheets

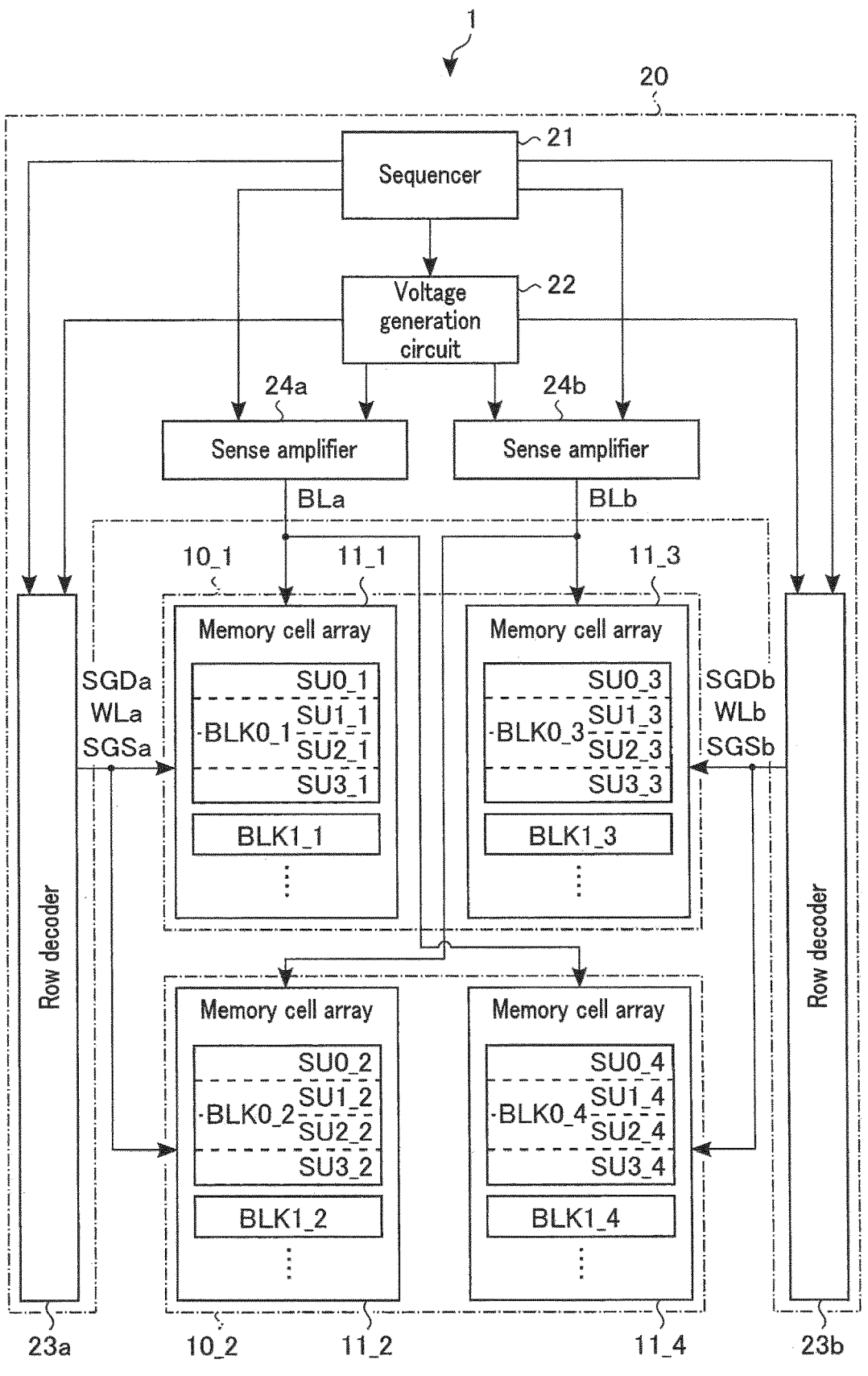
F I G. 1

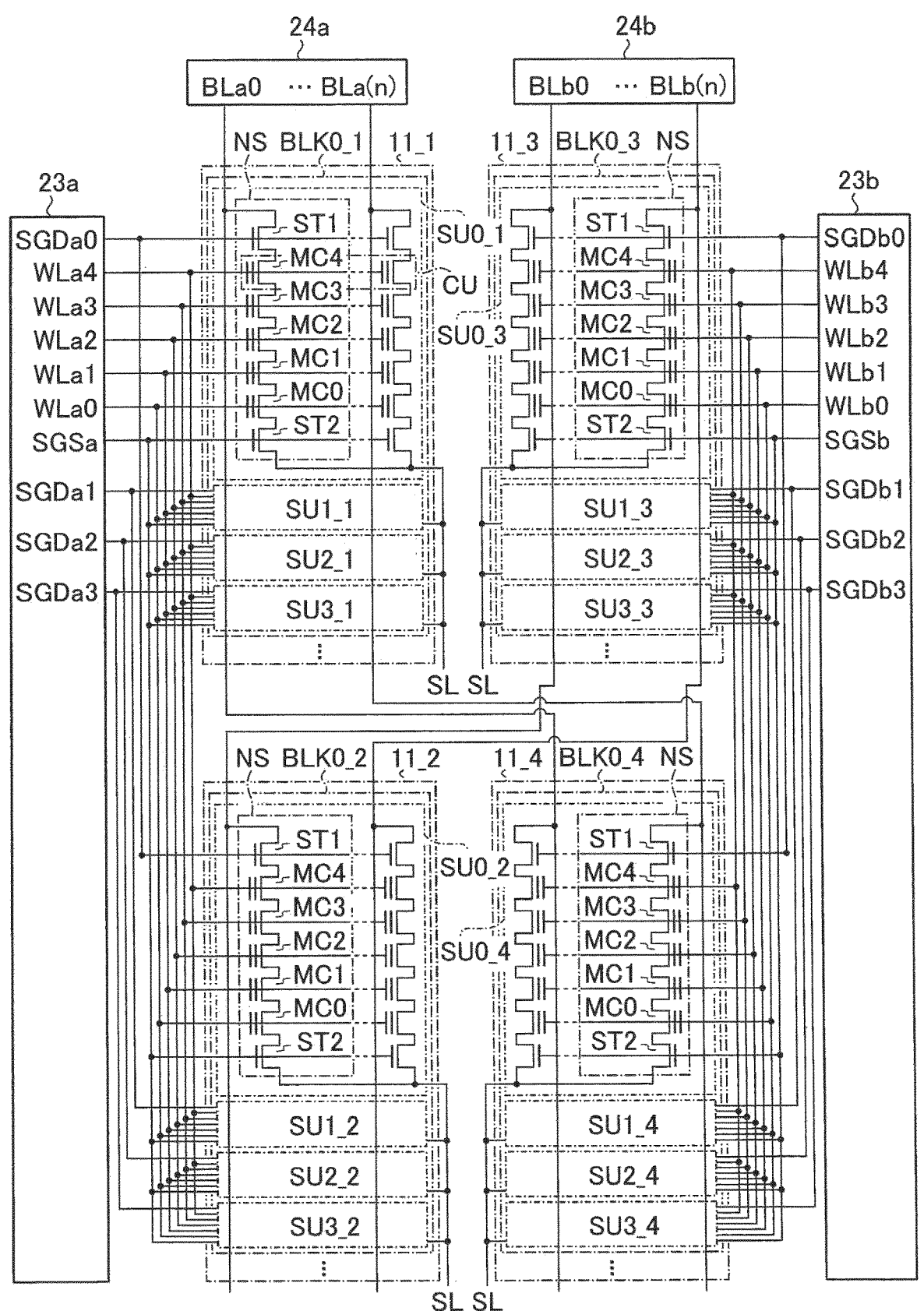
F I G. 2

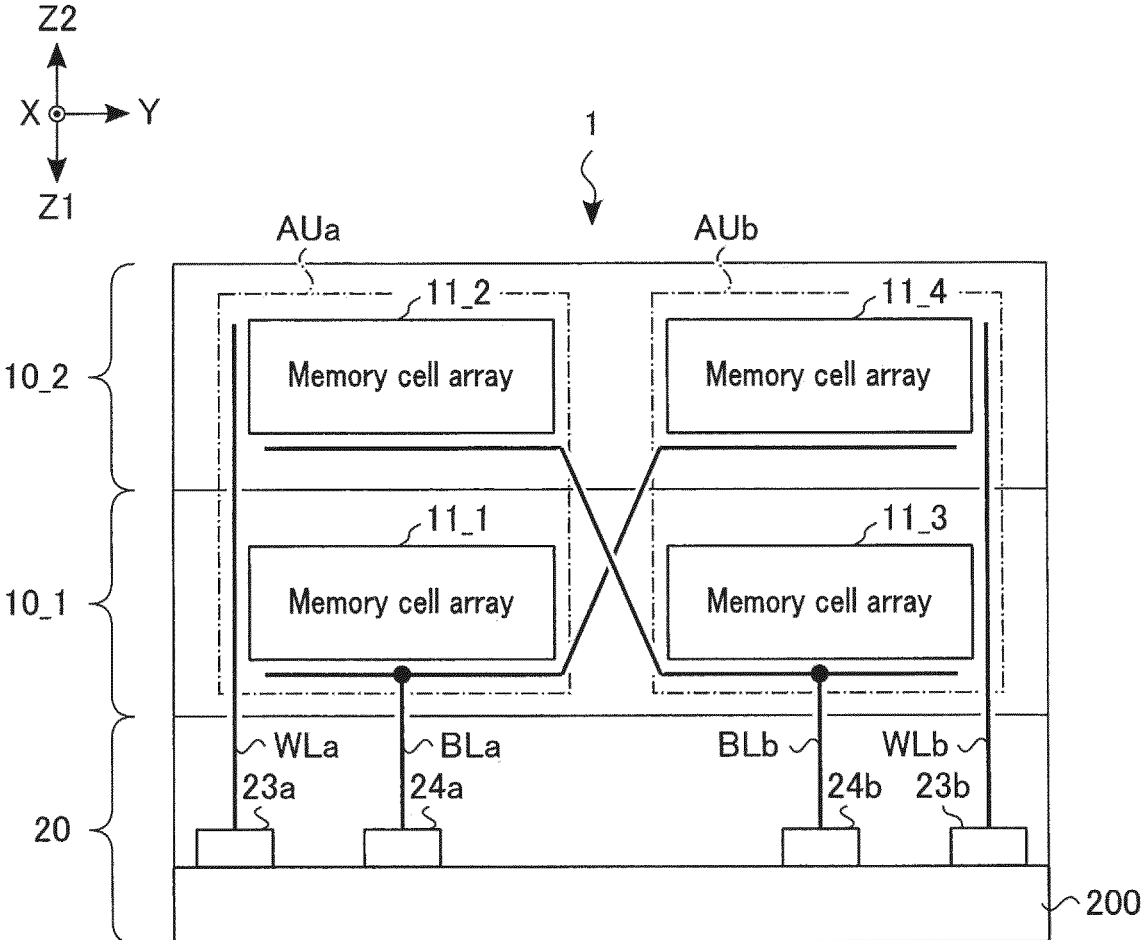
F I G. 3

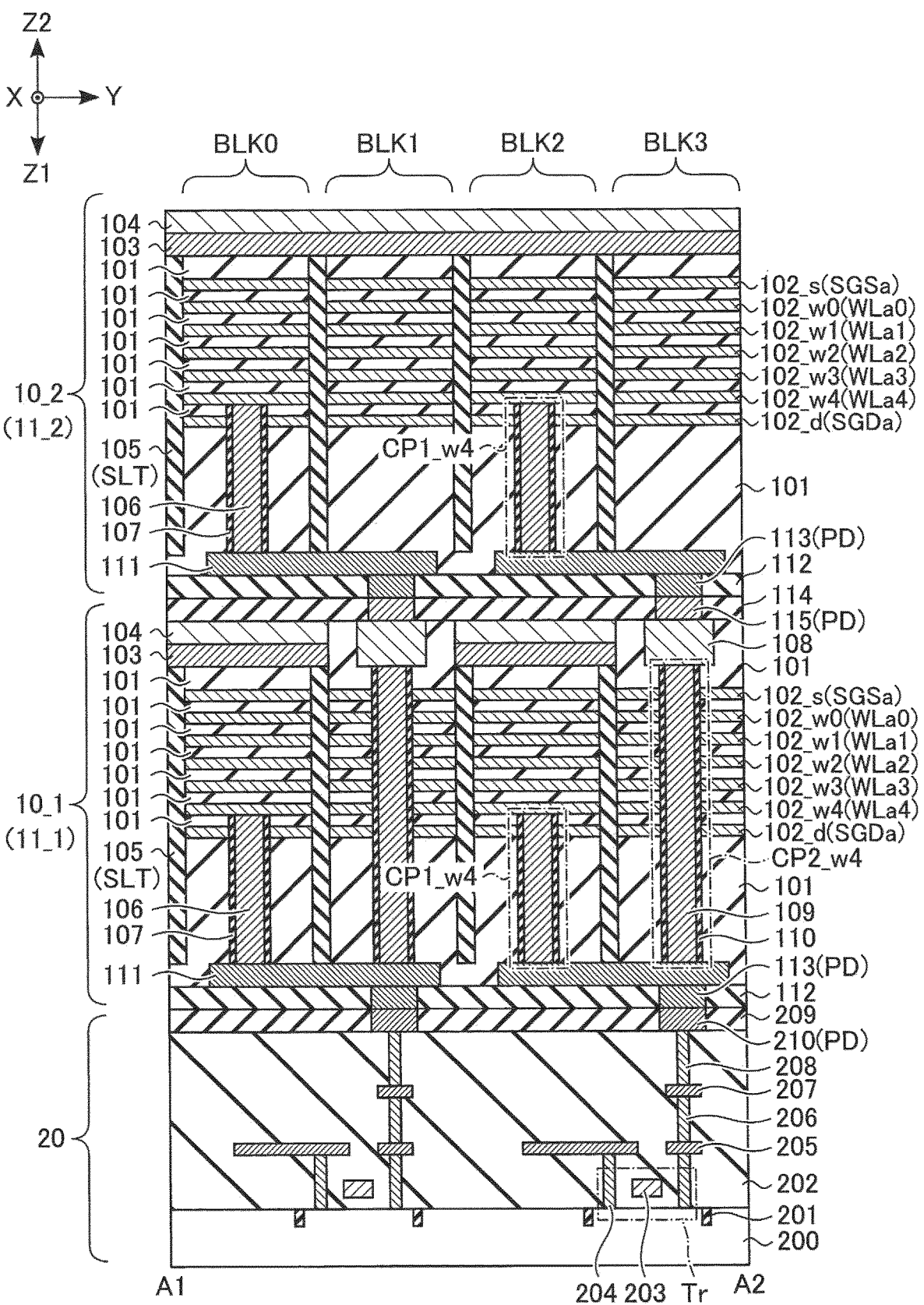
F I G. 7

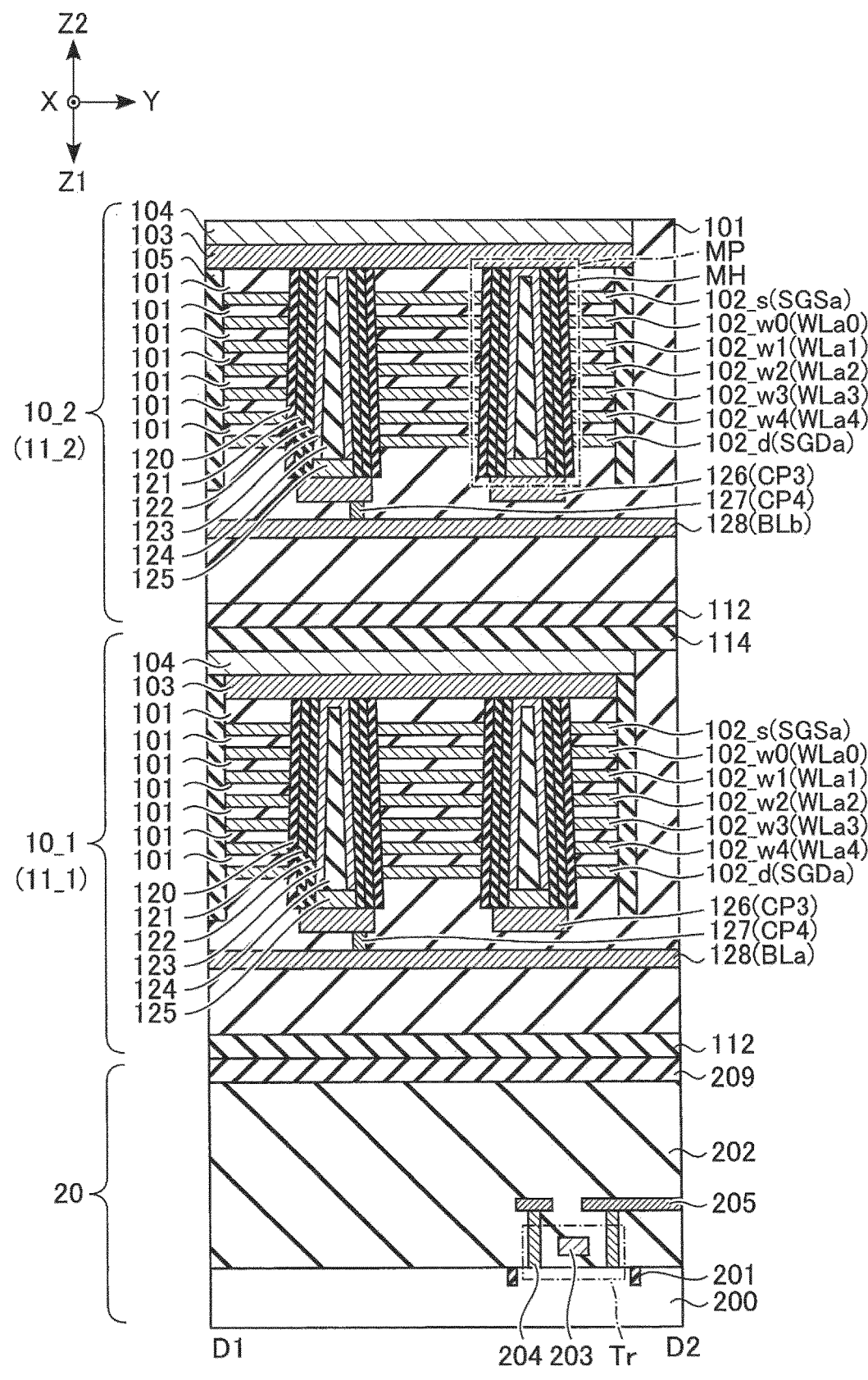
F I G. 10

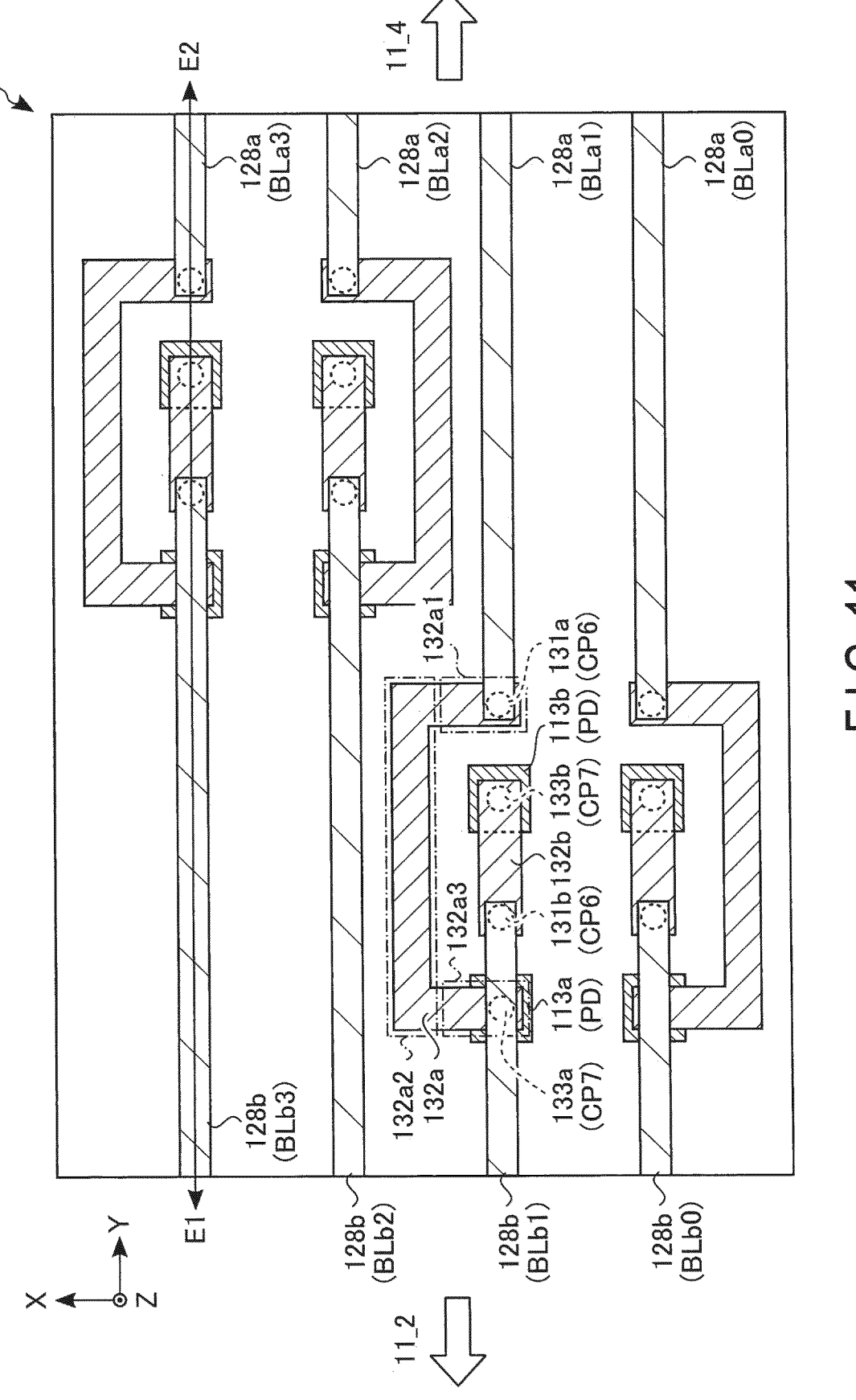
F I G. 11

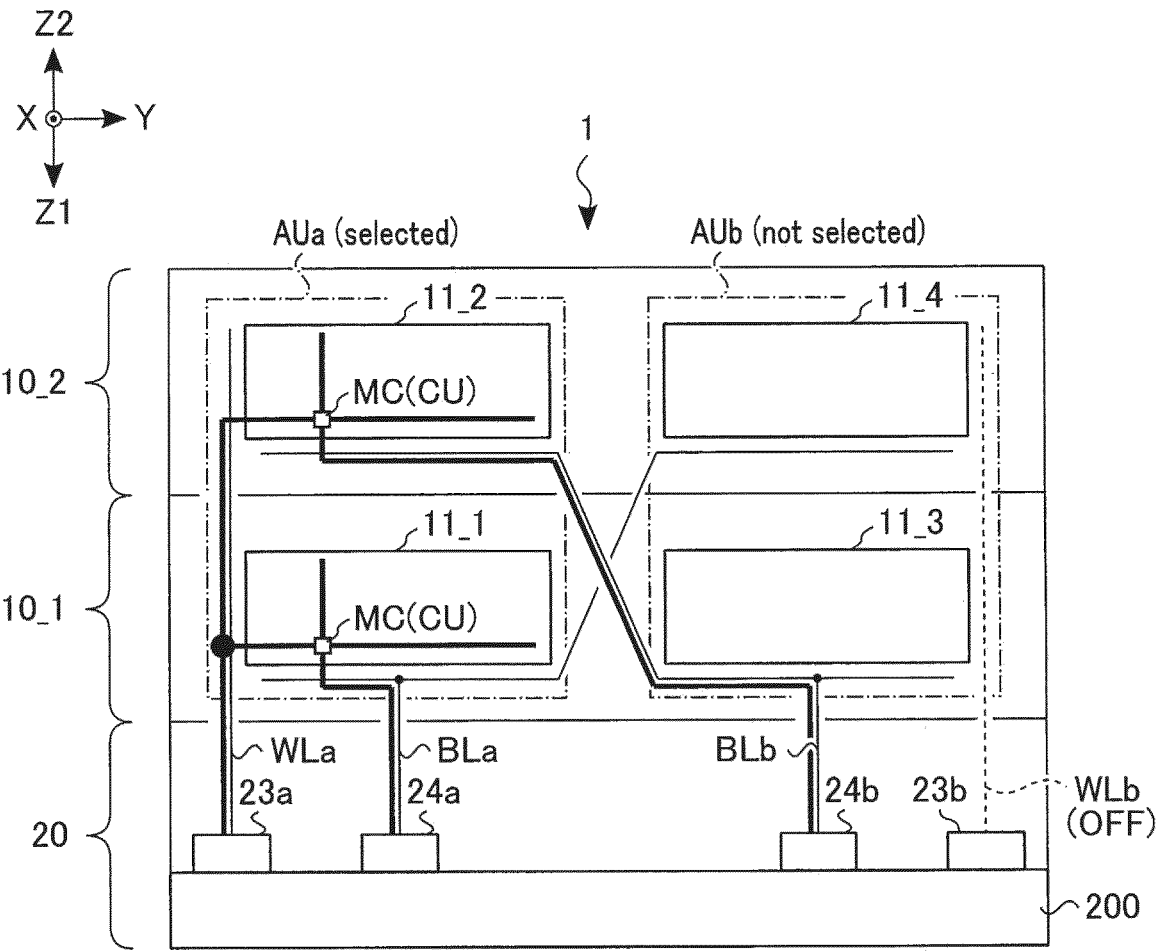
F I G. 13

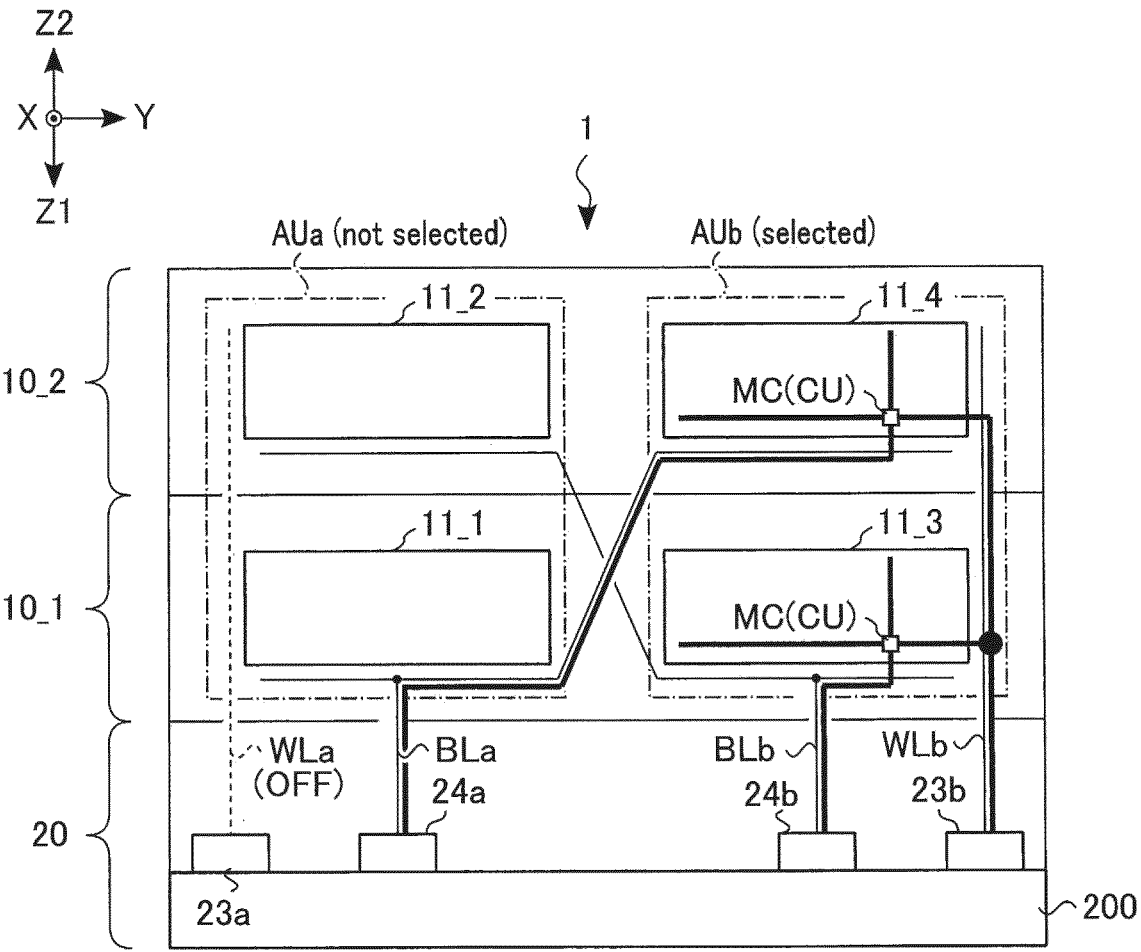
F I G. 14

Memory cell array 11_4

|  | SU0_4 (SGDb0) | SU1_4 (SGDb1) | SU2_4 (SGDb2) | SU3_4 (SGDb3) |
|---|---|---|---|---|
| WLb0 | b17 | b18 | b19 | b20 |
| WLb1 | b13 | b14 | b15 | b16 |
| WLb2 | b9 | b10 | b11 | b12 |
| WLb3 | b5 | b6 | b7 | b8 |
| WLb4 | b1 | b2 | b3 | b4 |

Memory cell array 11_3

|  | SU0_3 (SGDb0) | SU1_3 (SGDb1) | SU2_3 (SGDb2) | SU3_3 (SGDb3) |
|---|---|---|---|---|
| WLb0 | b17 | b18 | b19 | b20 |
| WLb1 | b13 | b14 | b15 | b16 |
| WLb2 | b9 | b10 | b11 | b12 |
| WLb3 | b5 | b6 | b7 | b8 |
| WLb4 | b1 | b2 | b3 | b4 |

Memory cell array 11_2

|  | SU0_2 (SGDa0) | SU1_2 (SGDa1) | SU2_2 (SGDa2) | SU3_2 (SGDa3) |
|---|---|---|---|---|
| WLa0 | a17 | a18 | a19 | a20 |
| WLa1 | a13 | a14 | a15 | a16 |
| WLa2 | a9 | a10 | a11 | a12 |
| WLa3 | a5 | a6 | a7 | a8 |
| WLa4 | a1 | a2 | a3 | a4 |

Memory cell array 11_1

|  | SU0_1 (SGDa0) | SU1_1 (SGDa1) | SU2_1 (SGDa2) | SU3_1 (SGDa3) |
|---|---|---|---|---|
| WLa0 | a17 | a18 | a19 | a20 |
| WLa1 | a13 | a14 | a15 | a16 |
| WLa2 | a9 | a10 | a11 | a12 |
| WLa3 | a5 | a6 | a7 | a8 |
| WLa4 | a1 | a2 | a3 | a4 |

BLb

BLa

F I G. 15

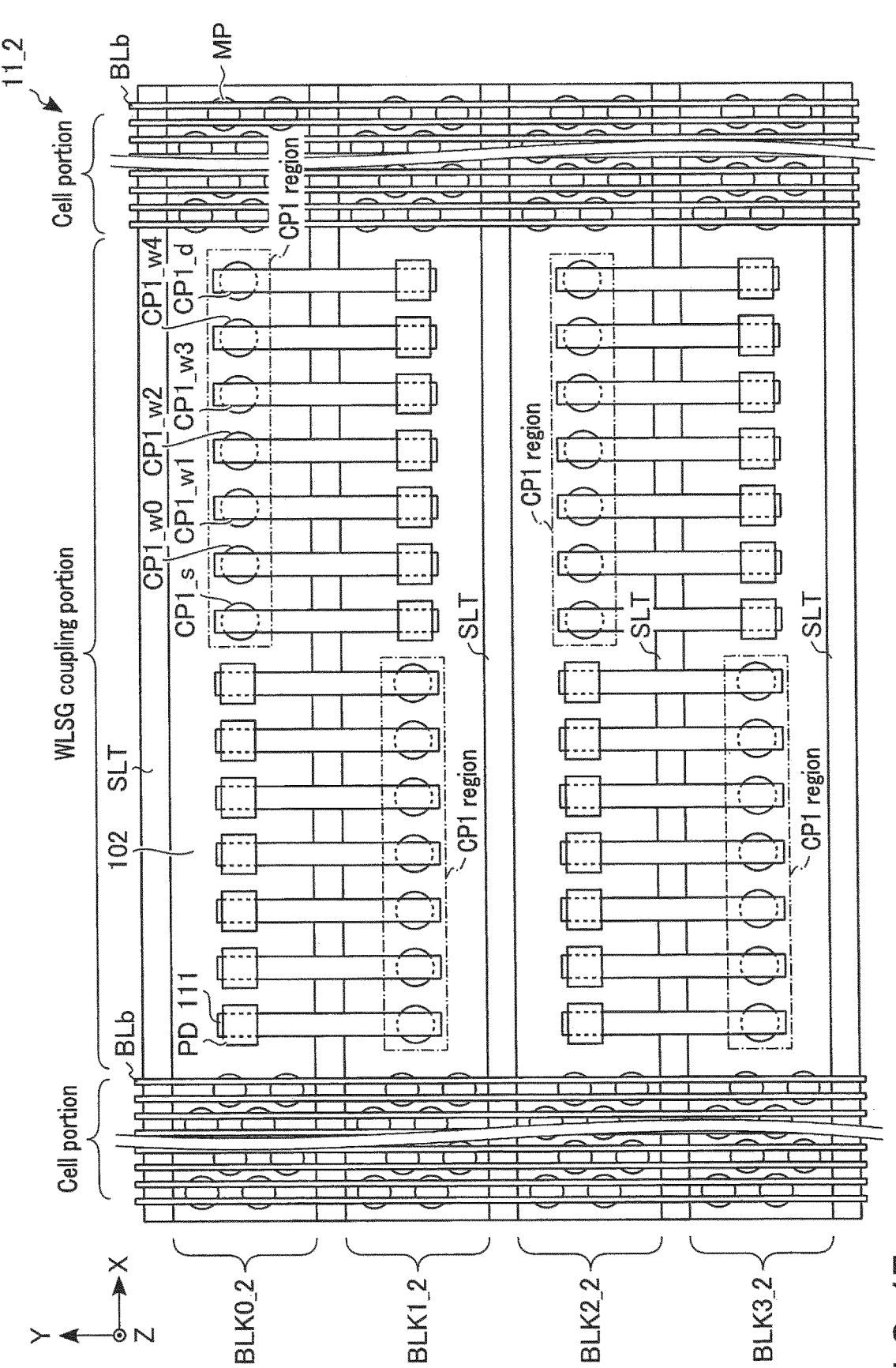
F I G. 17

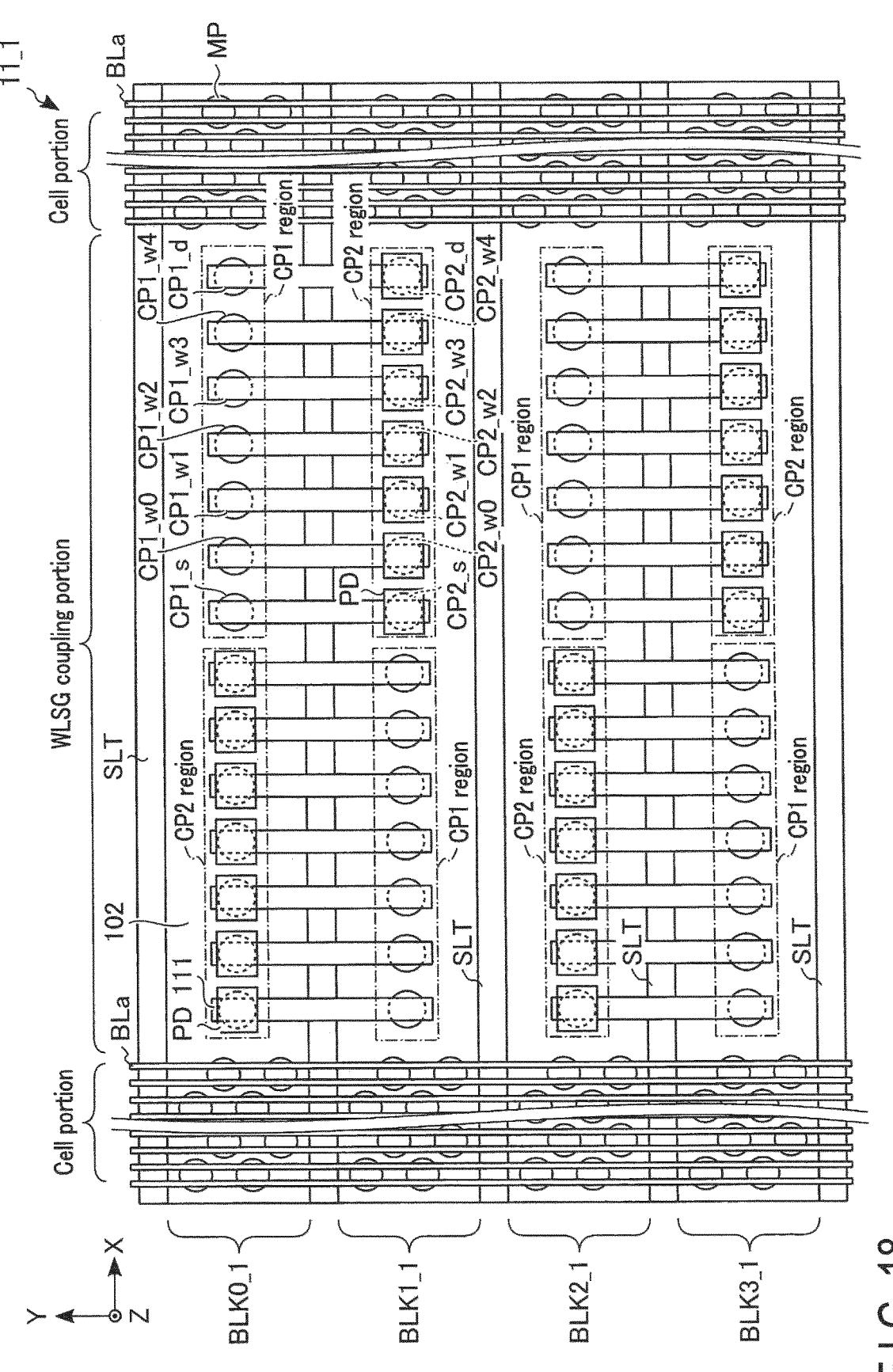
F I G. 18

SEMICONDUCTOR MEMORY DEVICE

CROSS-REFERENCE TO RELATED APPLICATIONS

This application is a Continuation application of U.S. application Ser. No. 17/841,362, filed Jun. 15, 2022, which is based upon and claims the benefit of priority from Japanese Patent Application No. 2021-185721, filed Nov. 15, 2021, the entire contents of both of which are incorporated herein by reference.

FIELD

Embodiments described herein relate generally to a semiconductor memory device.

BACKGROUND

A NAND-type flash memory is known as a semiconductor memory device.

BRIEF DESCRIPTION OF THE DRAWINGS

FIG. 1 is a block diagram illustrating the overall configuration of a semiconductor memory device according to a first embodiment;

FIG. 2 is a circuit diagram of memory cell arrays included in the semiconductor memory device according to the first embodiment;

FIG. 3 is a cross-sectional view illustrating an arrangement of a circuit chip 20, and array chips 10_1 and 10_2 included in the semiconductor memory device according to the first embodiment;

FIG. 7 is a cross-sectional view taken along line A1-A2 in FIGS. 5 and 6;

FIG. 10 is a cross-sectional view taken along line D1-D2 in FIGS. 5 and 6;

FIG. 11 is a plan view of a BL coupling portion of an array chip 10_2 included in the semiconductor memory device according to the first embodiment;

FIG. 13 is a conceptual diagram illustrating a case where cell units CU of an array unit AUa are selected in the semiconductor memory device according to the first embodiment;

FIG. 14 is a conceptual diagram illustrating a case where cell units CU of an array unit AUb are selected in the semiconductor memory device according to the first embodiment;

FIG. 15 is a diagram illustrating a write order of one block BLK of each memory cell array 11 in the semiconductor memory device according to the first embodiment;

FIG. 17 is a plan view of the memory cell array 11_2 included in the semiconductor memory device according to the second embodiment; and FIG. 18 is a plan view of the memory cell array 11_1 included in the semiconductor memory device according to the second embodiment.

DETAILED DESCRIPTION

Figure 4:
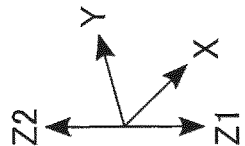
FIG. 4 is a perspective view illustrating an arrangement of memory cell arrays 11_1 to 11_4 and the circuit chip 20 included in the semiconductor memory device according to the first embodiment.

In general, according to one embodiment, a semiconductor memory device includes: a first memory cell array; a second memory cell array arranged above the first memory cell array in a first direction; a third memory cell array arranged adjacent to the first memory cell array in a second direction intersecting with the first direction; a fourth memory cell array arranged above the third memory cell array in the first direction and arranged adjacent to the second memory cell array in the second direction; a first word line coupled to the first memory cell array and the second memory cell array; a second word line coupled to the third memory cell array and the fourth memory cell array; a first bit line coupled to the first memory cell array and the fourth memory cell array; and a second bit line coupled to the second memory cell array and the third memory cell array.

Hereinafter, embodiments will be described with reference to the drawings. Note that, in the following description, constituent elements having substantially the same functions and configurations are denoted by the same reference numerals. Repetitive description may be omitted if not needed. In addition, each embodiment described below illustrates a device and a method for embodying a technical idea of the embodiment. The technical idea of the embodiment does not specify the material, shape, structure, arrangement, and the like of components described below. Various modifications can be made to the technical idea of the embodiment without departing from the gist of the invention. Such embodiments and modifications of the embodiments are included in the invention described in claims and the equivalent scope thereof.

1. First Embodiment

A semiconductor memory device according to a first embodiment will be described.

1.1 Overall Configuration of Semiconductor Memory Device

First, an example of the overall configuration of a semiconductor memory device 1 will be described with reference to FIG. 1. FIG. 1 is a block diagram illustrating the overall configuration of the semiconductor memory device 1. Note that some of couplings between respective constituent elements are indicated by arrow lines in FIG. 1. However, couplings between the constituent elements are not limited thereto.

The semiconductor memory device 1 is, for example, a three-dimensional (3D) stacked NAND-type flash memory. The 3D stacked NAND-type flash memory includes a plurality of non-volatile memory cell transistors three-dimensionally arranged on a semiconductor substrate.

As illustrated in FIG. 1, the semiconductor memory device 1 includes a plurality of array chips 10 and a circuit chip 20. The array chip 10 is a chip provided with arrays of non-volatile memory cell transistors. The circuit chip 20 is a chip provided with circuits that controls the array chips 10. The semiconductor memory device 1 according to the present embodiment is formed by bonding the plurality of array chips 10 and the circuit chip 20. Hereinafter, unless the chip is limited to the array chip 10 or the circuit chip 20, it is simply referred to as a "chip".

In the example of FIG. 1, the semiconductor memory device 1 includes two array chips 10_1 and 10_2. Note that the number of array chips 10 may be three or more. Hereinafter, unless the array chip is limited to the array chip 10_1 or 10_2, it is referred to as the array chip 10.

Each array chip 10 includes a plurality of memory cell arrays 11. The memory cell array 11 is a region in which non-volatile memory cell transistors are three-dimensionally arranged. In the example of FIG. 1, the array chip 10_1 includes memory cell arrays 11_1 and 11_3. The array chip 10_2 includes memory cell arrays 11_2 and 11_4. Note that each array chip 10 may include three or more memory cell arrays 11. Hereinafter, unless the memory cell array is limited to the memory cell array 11_1, 11_2, 11_3, or 11_4, it is referred to as the memory cell array 11.

The circuit chip 20 includes a sequencer 21, a voltage generator 22, a plurality of row decoders 23, and a plurality of sense amplifiers 24. In the example of FIG. 1, the semiconductor memory device 1 includes two row decoders 23a and 23b, and two sense amplifiers 24a and 24b. Hereinafter, unless the row decoder is limited to the row decoder 23a or 23b, it is referred to as the row decoder 23. Unless the sense amplifier is limited to the sense amplifier 24a or 24b, it is referred to as the sense amplifier 24.

The sequencer 21 is a circuit that performs control of the semiconductor memory device 1. The sequencer 21 is coupled to the voltage generator 22, the row decoders 23a and 23b, and the sense amplifiers 24a and 24b. The sequencer 21 controls the voltage generator 22, the row decoders 23a and 23b, and the sense amplifiers 24a and 24b. In addition, the sequencer 21 controls the overall operation of the semiconductor memory device 1 in accordance with the control of an external controller. More specifically, the sequencer 21 executes a write operation, a read operation, an erase operation, and the like.

The voltage generator 22 is a circuit that generates voltages used for the write operation, the read operation, the erase operation, and the like. The voltage generator 22 is coupled to the row decoders 23a and 23b, the sense amplifiers 24a and 24b, and the like. The voltage generator 22 supplies voltages to the row decoders 23a and 23b, the sense amplifiers 24a and 24b, and the like.

The row decoder 23 is a circuit that performs decoding of row addresses. The row address is an address signal that designates interconnects of the memory cell array 11 in a row direction. The address signal is included in a write instruction, a read instruction, an erase instruction, and the like received from the external controller. The row decoder 23 supplies the voltages applied from the voltage generator 22 to the memory cell arrays 11 based on the decoding result of the row address. In the present embodiment, one row decoder 23 is provided for two memory cell arrays 11.

For example, the row decoder 23a is commonly coupled to the memory cell arrays 11_1 and 11_2 via a plurality of word lines WLa, and a plurality of selection gate lines SGDa and SGSa. Similarly, the row decoder 23b is commonly coupled to the memory cell arrays 11_3 and 11_4 via a plurality of word lines WLb, and a plurality of selection gate lines SGDb and SGSb. The word lines WLa and WLb are interconnects used for controlling the memory cell transistors. The selection gate lines SGDa, SGDb, SGSa, and SGSb are interconnects used for selecting string units SU.

More specifically, the memory cell array 11_1 and the memory cell array 11_2 share the word lines WLa, and the selection gate lines SGDa and SGSa. That is, the word lines WLa of the memory cell array 11_1 and the word lines WLa of the memory cell array 11_2 are commonly coupled to the row decoder 23a. Similarly, the selection gate lines SGDa of the memory cell array 11_1 and the selection gate lines SGDa of the memory cell array 11_2 are commonly coupled to the row decoder 23a. In addition, the selection gate lines SGSa of the memory cell array 11_1 and the selection gate lines SGSa of the memory cell array 11_2 are commonly coupled to the row decoder 23a.

Similarly, the memory cell array 11_3 and the memory cell array 11_4 share the word lines WLb, and the selection gate lines SGDb and SGSb. That is, the word lines WLb of the memory cell array 11_3 and the word lines WLb of the memory cell array 11_4 are commonly coupled to the row decoder 23b. Similarly, the selection gate lines SGDb of the memory cell array 11_3 and the selection gate lines SGDb of the memory cell array 11_4 are commonly coupled to the row decoder 23b. In addition, the selection gate lines SGSb of the memory cell array 11_3 and the selection gate lines SGSb of the memory cell array 11_4 are commonly coupled to the row decoder 23b.

The sense amplifier 24 is a circuit that performs writing and reading of data. The sense amplifier 24 senses data read from the corresponding memory cell arrays 11 during the read operation. In addition, the sense amplifier 24 supplies voltages corresponding to write data to the memory cell arrays 11 during the write operation. In the present embodiment, one sense amplifier 24 is provided for two memory cell arrays 11.

The sense amplifier 24a is commonly coupled to the memory cell arrays 11_1 and 11_4 via a plurality of bit lines BLa. Similarly, the sense amplifier 24b is commonly coupled to the memory cell arrays 11_2 and 11_3 via a plurality of bit lines BLb.

More specifically, the memory cell array 11_1 and the memory cell array 11_4 share the bit lines BLa. That is, the bit lines BLa of the memory cell array 11_1 and the bit lines BLa of the memory cell array 11_4 are commonly coupled to the sense amplifier 24a. Similarly, the memory cell array 11_2 and the memory cell array 11_3 share the bit lines BLb. That is, the bit lines BLb of the memory cell array 11_2 and the bit lines BLb of the memory cell array 11_3 are commonly coupled to the sense amplifier 24b.

Next, the internal configuration of the memory cell array 11 will be described. The memory cell array 11 includes a plurality of blocks BLK. The block BLK is, for example, a set of a plurality of memory cell transistors from which data is collectively erased. The plurality of memory cell transistors in the block BLK are associated with rows and columns. In the example of FIG. 1, the memory cell array 11_1 includes a BLK0_1, a BLK1_1, . . . . The memory cell array 11_2 includes a BLK0_2, a BLK1_2, . . . . The memory cell array 11_3 includes a BLK0_3, a BLK1_3, . . . . The memory cell array 11_4 includes a BLK0_4, a BLK1_4, . . . . Hereinafter, unless the block is limited to which block of which memory cell array 11 it is, it is referred to as the block BLK.

The block BLK includes a plurality of string units SU. The string unit SU is, for example, a set of a plurality of NAND strings that are collectively selected in the write operation or the read operation. The NAND string includes a set of a plurality of memory cell transistors that are coupled in series. In the example of FIG. 1, each block BLK includes four string units SU0 to SU3. More specifically, for example, the block BLK0_1 includes four string units SU0_1, SU1_1, SU2_1, and SU3_1. The block BLK0_2 includes four string units SU0_2, SU1_2, SU2_2, and SU3_2. The block BLK0_3 includes four string units SU0_3, SU1_3, SU2_3, and SU3_3. The block BLK0_4 includes four string units SU0_4, SU1_4, SU2_4, and SU3_4. Hereinafter, unless the string unit is limited to which string unit of which memory cell array 11 it is, it is referred to as the string unit SU.

Note that the number of blocks BLK in the memory cell array 11 and the number of string units SU in the block BLK are freely set. The circuit configuration of the memory cell array 11 will be described later.

1.2 Circuit Configuration of Memory Cell Array

Next, an example of the circuit configuration of the memory cell arrays 11_1 to 11_4 will be described with reference to FIG. 2. FIG. 2 is a circuit diagram of the memory cell arrays 11_1 to 11_4.

As illustrated in FIG. 2, the string unit SU includes a plurality of NAND strings NS.

The NAND string NS includes a plurality of memory cell transistors MC, and selection transistors ST1 and ST2. In the example of FIG. 2, the NAND string NS includes five memory cell transistors MC0 to MC4. Note that the number of memory cell transistors MC is freely set.

The memory cell transistor MC stores data in a non-volatile manner. The memory cell transistor MC includes a control gate and a charge storage layer. The memory cell transistor MC may be of a metal-oxide-nitride-oxide-silicon (MONOS) type, or of a floating gate (FG) type. In the MONOS type, an insulating layer is used as the charge storage layer. In the FG type, a conductive layer is used as the charge storage layer. Hereinafter, a case will be described where the memory cell transistor MC is of the MONOS type.

The selection transistors ST1 and ST2 are used for selecting the string units SU during various operations. The number of selection transistors ST1 and ST2 are freely set. It is sufficient that one or more selection transistors ST1 and one or more selection transistors ST2 are included in the NAND string NS.

In each NAND string NS, current paths of the memory cell transistors MC, and current paths of the selection transistors ST1 and ST2 are coupled in series. In the example of FIG. 2, the selection transistor ST2, the memory cell transistors MC0, MC1, MC2, MC3, and MC4, and the selection transistor ST1 are arranged in this order from the lower side toward the upper side in the drawing. The current paths are coupled in series. In other words, the selection transistor ST2, the memory cell transistors MC0, MC1, MC2, MC3, and MC4, and the selection transistor ST1 are coupled in this order from a source line SL to bit lines BL. A drain of the selection transistor ST1 is coupled to any of the bit lines BL. A source of the selection transistor ST2 is coupled to the source line SL.

In the string unit SU, drains of a plurality of selection transistors ST1 are coupled to different bit lines BL. In the example of FIG. 2, in the string unit SU, drains of the selection transistors ST1 of n+1 (n being an integer of 0 or more) NAND strings NS are coupled to the respective n+1 bit lines BL. In each string unit SU of two memory cell arrays 11, a drain of one selection transistor ST1 is commonly coupled to one bit line BL. That is, the two memory cell arrays 11 share the bit lines BL.

More specifically, n+1 selection transistors ST1 of each string unit SU of the memory cell array 11_1 and n+1 selection transistors ST1 of each string unit SU of the memory cell array 11_4 are commonly coupled to the respective n+1 bit lines BLa0 to BLa(n). For example, a drain of one selection transistor ST1 of each of the string units SU0_1 to SU3_1 and a drain of one selection transistor ST1 of each of the string units SU0_4 to SU3_4 are commonly coupled to the bit line BLa0. Similarly, n+1 selection transistors ST1 of each string unit SU of the memory cell array 11_2 and n+1 selection transistors ST1 of each string unit SU of the memory cell array 11_3 are commonly coupled to the respective n+1 bit lines BLb0 to BLb(n).

Control gates of a plurality of memory cell transistors MC0 to MC4 included in one block BLK of the memory cell array 11_1 and control gates of a plurality of memory cell transistors MC0 to MC4 included in one block BLK of the memory cell array 11_2 are commonly coupled to word lines WLa0 to WLa4, respectively. More specifically, the blocks BLK0_1 and BLK0_2 include a plurality of memory cell transistors MC0. The control gates of the plurality of memory cell transistors MC0 are commonly coupled to one word line WLa0. Similarly, other memory cell transistors MC1 to MC4 are commonly coupled to the word lines WLa1 to WLa4, respectively. That is, the block BLK0_1 and the block BLK0_2 share the word lines WL. The same applies to other blocks BLK of the memory cell arrays 11_1 and 11_2.

Similarly, control gates of a plurality of memory cell transistors MC0 to MC4 included in one block BLK of the memory cell array 11_3 and control gates of a plurality of memory cell transistors MC0 to MC4 included in one block BLK of the memory cell array 11_4 are commonly coupled to word lines WLb0 to WLb4, respectively. More specifically, the blocks BLK0_3 and BLK0_4 include a plurality of memory cell transistors MC0. The control gates of the plurality of memory cell transistors MC0 are commonly coupled to one word line WLb0. Similarly, other memory cell transistors MC1 to MC4 are commonly coupled to the word lines WLb1 to WLb4, respectively. That is, the block BLK0_3 and the block BLK0_4 share the word lines WL. The same applies to other blocks BLK of the memory cell arrays 11_3 and 11_4.

Gates of a plurality of selection transistors ST1 included in one string unit SU of one block BLK of the memory cell array 11_1 and gates of a plurality of selection transistors ST1 included in one string unit SU of one block BLK of the memory cell array 11_2 are commonly coupled to a selection gate line SGDa. For example, the string unit SU0_1 of the block BLK0_1 and the string unit SU0_2 of the block BLK0_2 include a plurality of selection transistors ST1. The gates of the plurality of selection transistors ST1 are commonly coupled to one selection gate line SGDa0. That is, the string unit SU0_1 of the block BLK0_1 and the string unit SU0_2 of the block BLK0_2 share the selection gate line SGDa0. Similarly, a plurality of selection transistors ST1 of the string unit SU1_1 of the block BLK0_1 and a plurality of selection transistors ST1 of the string unit SU1_2 of the block BLK0_2 are commonly coupled to a selection gate line SGDa1. A plurality of selection transistors ST1 of the string unit SU2_1 of the block BLK0_1 and a plurality of selection transistors ST1 of the string unit SU2_2 of the block BLK0_2 are commonly coupled to a selection gate line SGDa2. A plurality of selection transistors ST1 of the string unit SU3_1 of the block BLK0_1 and a plurality of selection transistors ST1 of the string unit SU3_2 of the block BLK0_2 are commonly coupled to a selection gate line SGDa3. The same applies to other blocks BLK of the memory cell arrays 11_1 and 11_2.

In addition, gates of a plurality of selection transistors ST1 included in one string unit SU of one block BLK of the memory cell array 11_3 and gates of a plurality of selection transistors ST1 included in one string unit SU of one block BLK of the memory cell array 11_4 are commonly coupled to a selection gate line SGDb. For example, a plurality of selection transistors ST1 of the string unit SU0_3 of the block BLK0_3 and a plurality of selection transistors ST1 of the string unit SU0_4 of the block BLK0_4 are commonly coupled to a selection gate line SGDb0. Similarly, a plurality of selection transistors ST1 of the string unit SU1_3 of the block BLK0_3 and a plurality of selection transistors ST1 of the string unit SU1_4 of the block BLK0_4 are commonly coupled to a selection gate line SGDb1. A plurality of selection transistors ST1 of the string unit SU2_3 of the block BLK0_3 and a plurality of selection transistors ST1 of the string unit SU2_4 of the block BLK0_4 are commonly coupled to a selection gate line SGDb2. A plurality of selection transistors ST1 of the string unit SU3_3 of the block BLK0_3 and a plurality of selection transistors ST1 of the string unit SU3_4 of the block BLK0_4 are commonly coupled to a selection gate line SGDb3. The same applies to other blocks BLK of the memory cell arrays 11_3 and 11_4.

Gates of a plurality of selection transistors ST2 included in one block BLK of the memory cell array 11_1 and gates of a plurality of selection transistors ST2 included in one block BLK of the memory cell array 11_2 are commonly coupled to one selection gate line SGSa. More specifically, for example, the blocks BLK0_1 and BLK0_2 include a plurality of selection transistors ST2. The gates of the plurality of selection transistors ST2 are commonly coupled to one selection gate line SGSa. That is, the blocks BLK0_1 and BLK0_2 share the selection gate line SGSa. The same applies to other blocks BLK of the memory cell arrays 11_1 and 11_2. Note that the memory cell arrays 11_1 and 11_2 may share different selection gate lines SGSa for each string unit SU.

In addition, gates of a plurality of selection transistors ST2 included in one block BLK of the memory cell array 11_3 and gates of a plurality of selection transistors ST2 included in one block BLK of the memory cell array 11_4 are commonly coupled to one selection gate line SGSb. More specifically, for example, the blocks BLK0_3 and BLK0_4 include a plurality of selection transistors ST2. The gates of the plurality of selection transistors ST2 are commonly coupled to one selection gate line SGSb. That is, the blocks BLK0_3 and BLK0_4 share the selection gate line SGSb. The same applies to other blocks BLK of the memory cell arrays 11_3 and 11_4. Note that the memory cell arrays 11_3 and 11_4 may share different selection gate lines SGSb for each string unit SU.

Source lines SL are, for example, shared among a plurality of blocks BLK of the memory cell arrays 11_1 to 11_4.

Hereinafter, a set of a plurality of memory cell transistors MC coupled to one word line WL in one string unit SU is referred to as a "cell unit CU". For example, when the memory cell transistor MC stores 1-bit data, a storage capacity of the cell unit CU is defined as "one-page data". The cell unit CU may have the storage capacity of two or more page data in accordance with the number of bits of data that the memory cell transistor MC stores.

In the present embodiment, in the write operation and the read operation, two cell units CU of two memory cell arrays 11 to which a word line WL is commonly coupled can be simultaneously selected. For example, in the write operation or the read operation, when the row decoder 23a selects the word line WLa0 and the selection gate line SGDa0, two cell units CU, that is, the cell unit CU that includes the memory cell transistors MC0 of the string unit SU0_1 and the cell unit CU that includes the memory cell transistors MC0 of the string unit SU0_2, are selected. In this case, a voltage is applied from the sense amplifier 24a to the cell unit CU of the string unit SU0_1 via the bit line BLa. A voltage is applied from the sense amplifier 24b to the cell unit CU of the string unit SU0_2 via the bit line BLb. Therefore, in the write operation or the read operation, page data of each of the two cell units CU can be collectively processed.

1.3 Arrangement of Chips

Next, an example of an arrangement of each chip will be described with reference to FIG. 3. FIG. 3 is a cross-sectional view illustrating the arrangement of the circuit chip 20, and the array chips 10_1 and 10_2. Note that, in the example of FIG. 3, in order to simplify the description, one word line WLa, one word line WLb, one bit line BLa, and one bit line BLb are illustrated. The selection gate lines SGD and SGS, and the source lines SL are omitted.

Hereinafter, a direction substantially parallel to a surface of the circuit chip 20 is referred to as an X direction. A direction that intersects with the X direction and is substantially parallel to the surface of the circuit chip 20 is referred to as a Y direction. A direction that intersects with the X direction and the Y direction and is substantially perpendicular to the surface of the circuit chip 20 is referred to as a Z direction. When the Z direction is further limited, a direction from the array chip 10 toward the circuit chip 20 is referred to as a Z1 direction, and a direction opposite to the Z1 direction is referred to as a Z2 direction.

As illustrated in FIG. 3, the array chip 10_1 is provided on the circuit chip 20 in the Z2 direction. The array chip 10_2 is provided on the array chip 10_1.

In the circuit chip 20, the row decoders 23a and 23b, and the sense amplifiers 24a and 24b are provided on a semiconductor substrate 200.

In the array chip 10_1, for example, the memory cell arrays 11_1 and 11_3 are arranged side by side in the Y direction. For example, the memory cell array 11_1 is provided above the row decoder 23a and the sense amplifier 24a in the Z2 direction. In addition, for example, the memory cell array 11_3 is provided above the row decoder 23b and the sense amplifier 24b in the Z2 direction.

In the array chip 10_2, for example, the memory cell arrays 11_2 and 11_4 are arranged side by side in the Y direction. The memory cell array 11_2 is provided above the memory cell array 11_1 in the Z2 direction. The memory cell array 11_4 is provided above the memory cell array 11_3 in the Z2 direction. That is, the memory cell arrays 11_1 and 11_2 are stacked in the Z direction. Similarly, the memory cell arrays 11_3 and 11_4 are stacked in the Z direction.

Hereinafter, a set of a plurality of memory cell arrays 11 to which a word line WL is commonly coupled and stacked in the Z direction is referred to as an array unit AU. More specifically, for example, the memory cell arrays 11_1 and 11_2 constitute an array unit AUa. In addition, the memory cell arrays 11_3 and 11_4 constitute an array unit AUb. The semiconductor memory device 1 includes two array units AUa and AUb arranged adjacent to each other in the Y direction.

One end of the word line WLa is coupled to the row decoder 23a. The word line WLa is commonly coupled to the memory cell arrays 11_1 and 11_2 stacked in the Z direction. One end of the word line WLb is coupled to the row decoder 23b. The word line WLb is commonly coupled to the memory cell arrays 11_3 and 11_4 stacked in the Z direction.

The bit line BLa is coupled to the sense amplifier 24a. The bit line BLa is commonly coupled to the memory cell arrays 11_1 and 11_4 arranged at different positions from each other in the Z direction and the Y direction. The bit line BLb is coupled to the sense amplifier 24b. The bit line BLb is commonly coupled to the memory cell arrays 11_2 and 11_3 arranged at different positions from each other in the Z direction and the Y direction. That is, the bit line BL is commonly coupled to one memory cell array 11 of one array unit AU and one memory cell array 11 provided in a different array chip 10 of the other array unit AU. In other words, the bit line BL is commonly coupled to two memory cell arrays 11 that do not share the word line WL and are provided in different array chips 10.

1.4 Arrangement of Memory Cell Arrays

Next, an example of an arrangement of memory cell arrays will be described with reference to FIG. 4. FIG. 4 is a perspective view illustrating the arrangement of the memory cell arrays 11_1 to 11_4 and the circuit chip 20. Note that, in the example of FIG. 4, in order to simplify the description, one word line WLa, one word line WLb, one selection gate line SGDa, one selection gate line SGDb, one selection gate line SGSa, and one selection gate line SGSb, and four bit lines BLa and four bit lines BLb are illustrated in each memory cell array 11. The source lines SL are omitted.

As illustrated in FIG. 4, the memory cell array 11 includes a cell portion and a WLSG coupling portion. The cell portion is a region in which the memory cell transistors are arranged. The WLSG coupling portion is a region in which a plurality of contact plugs, each coupled to a corresponding one of the word lines WL and the selection gate lines SGD and SGS, are provided. For example, the word lines WLa and the selection gate lines SGDa and SGSa of the memory cell arrays 11_1 and 11_2 are commonly coupled to the row decoder 23a of the circuit chip 20. The word lines WLb and the selection gate lines SGDb and SGSb of the memory cell arrays 11_3 and 11_4 are commonly coupled to the row decoder 23b of the circuit chip 20.

BL coupling portions are provided between the memory cell array 11_1 and the memory cell array 11_3, and between the memory cell array 11_2 and the memory cell array 11_4. The BL coupling portion is a coupling region for coupling the bit lines BL provided in the array chip 10_1 and the bit lines BL provided in the array chip 10_2 to each other. More specifically, for example, a plurality of bit lines BL extending in the Y direction are provided in the cell portion of each memory cell array 11. In the BL coupling portion, the bit lines BLa of the memory cell array 11_1 and the bit lines BLa of the memory cell array 11_4 are coupled. The bit lines BLa of the memory cell array 11_1 extend from the cell portion in the Z direction, and are coupled to the sense amplifier 24a of the circuit chip 20. In addition, in the BL coupling portion, the bit lines BLb of the memory cell array 11_2 and the bit lines BLb of the memory cell array 11_3 are coupled. The bit lines BLb of the memory cell array 11_3 extend from the cell portion in the Z direction, and are coupled to the sense amplifier 24b of the circuit chip 20.

Note that, in the example of FIG. 4, for example, in the vicinity of the center portion of the cell portion of the memory cell array 11_1, coupling portions with the sense amplifier 24a are provided in intermediate portions of the bit lines BLa, but the present invention is not limited thereto. For example, coupling portions may be provided at ends of the bit lines BLa. In addition, the coupling portions of the bit lines BLa do not need to be arranged side by side in the X direction. The same applies to the bit lines BLb.

1.5 Planar Configuration of Memory Cell Array

Figure 5:
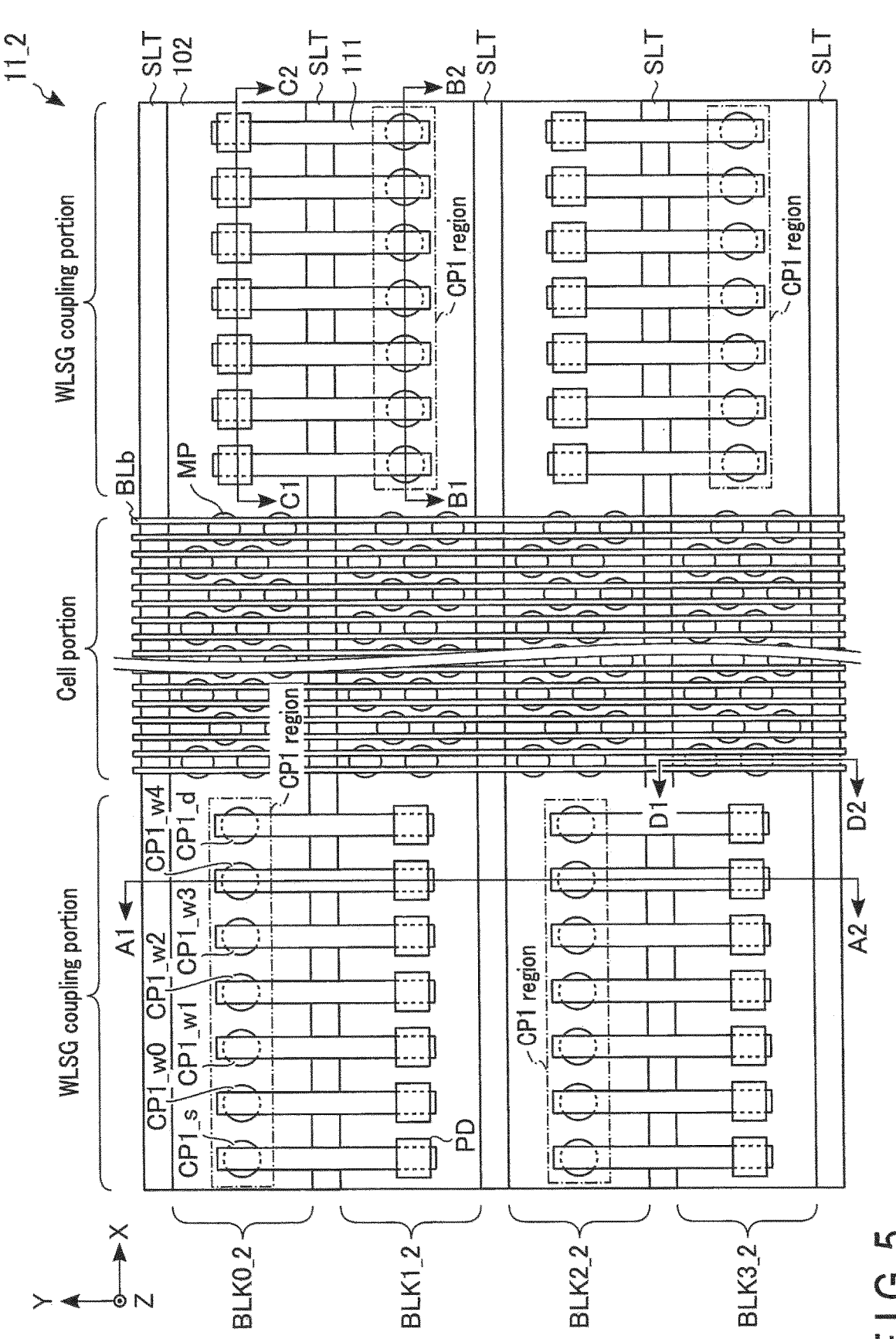
FIG. 5 is a plan view of the memory cell array 11_2 included in the semiconductor memory device according to the first embodiment.
Figure 6:
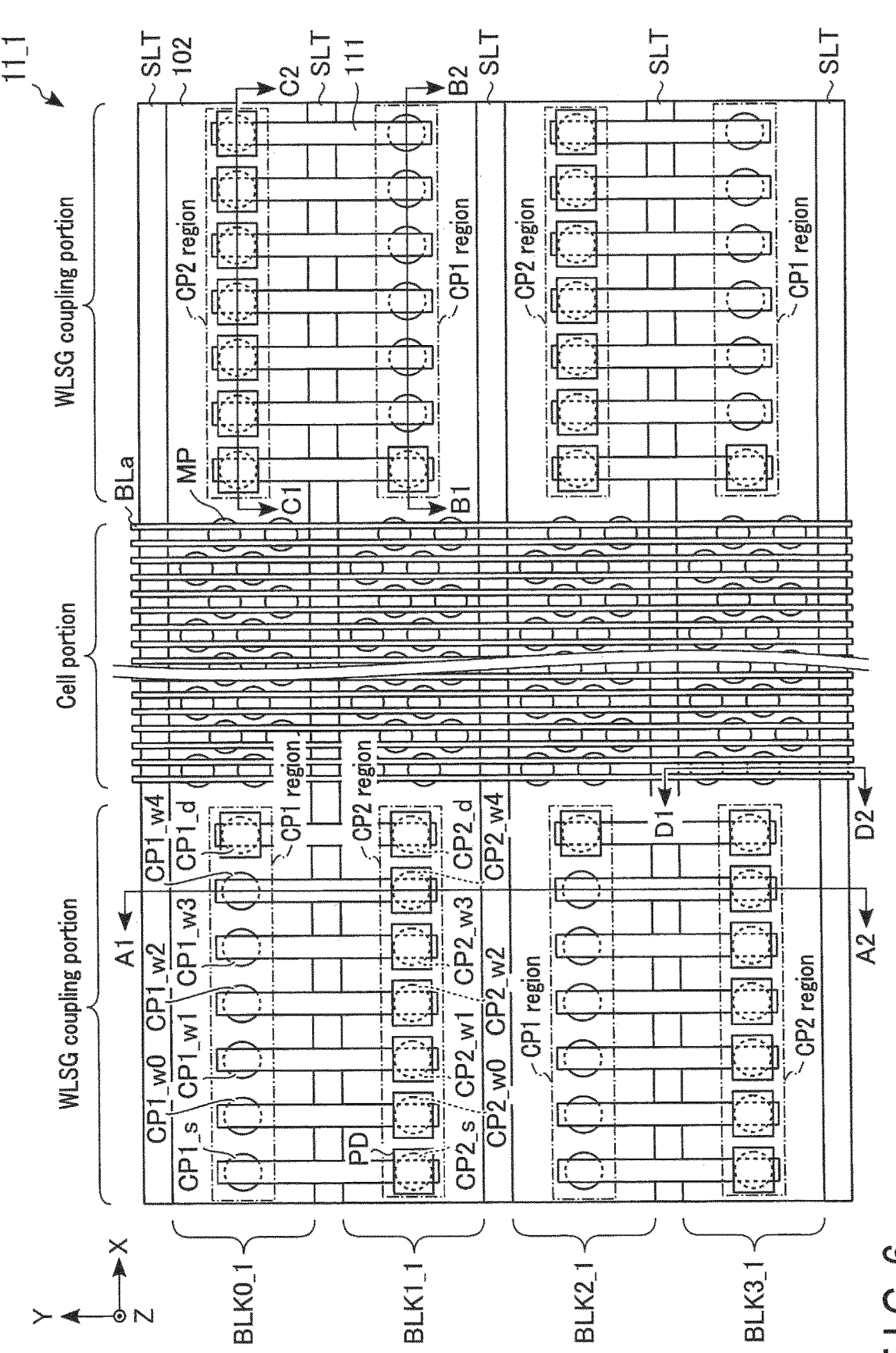
FIG. 6 is a plan view of the memory cell array 11_1 included in the semiconductor memory device according to the first embodiment.

Next, an example of the configuration of the memory cell array 11 will be described with reference to FIGS. 5 and 6. FIG. 5 is a plan view of the memory cell array 11_2. FIG. 6 is a plan view of the memory cell array 11_1. Note that, in the example of FIGS. 5 and 6, in order to simplify the description, a case will be described where each memory cell array 11 includes four blocks BLK0 to BLK3, and each block BLK includes one string unit SU. In addition, in the example of FIGS. 5 and 6, insulating layers are omitted. The configuration of the memory cell array 11_3 is similar to that of the memory cell array 11_1. The configuration of the memory cell array 11_4 is similar to that of the memory cell array 11_2.

First, the planar configuration of the memory cell array 11_2 will be described.

As illustrated in FIG. 5, four blocks BLK0_2 to BLK3_2 are arranged side by side in the Y direction from the upper side toward the lower side in the drawing. In each block BLK, a plurality of interconnect layers 102 are stacked apart from each other in the Z direction. For example, seven interconnect layers 102 are stacked. Each interconnect layer 102 extends in the X direction. Each of the interconnect layers 102 functions as (is included in) a corresponding one of the selection gate line SGS, the word lines WL0 to WL4, and the selection gate line SGD. Slits SLT are formed on the respective two side surfaces, facing the Y direction, of each interconnect layer 102. The slit SLT extends in the X direction and the Z direction. The slit SLT separates the interconnect layers 102 for each block BLK.

The block BLK includes the cell portion and the WLSG coupling portions.

The cell portion is provided with a plurality of memory pillars MP. The memory pillar MP is a pillar corresponding to the NAND string NS. Details of the structure of the memory pillar MP will be described later. The memory pillar MP has a substantially columnar shape and extends in the Z direction. The memory pillar MP penetrates (passes through) the plurality of interconnect layers 102 stacked in the Z direction.

In the example of FIG. 5, the plurality of memory pillars MP in the block BLK are arranged in a staggered manner in two rows in the X direction. Note that an array of the memory pillars MP can be freely designed. The array of the memory pillars MP may be, for example, a staggered arrangement in eight rows. In addition, the array of the memory pillars MP may not be the staggered arrangement.

A plurality of bit lines BLb are arranged side by side in the X direction above the memory pillars MP. The bit line BLb extends in the Y direction. The memory pillars MP of each block BLK are each electrically coupled to any of the bit lines BLb.

The WLSG coupling portion of the memory cell array 11_2 includes CP1 regions.

The CP1 region is a region in which a plurality of contact plugs CP1 are provided. The contact plug CP1 extends in the Z direction. Each of the contact plugs CP1 is coupled to any one of the interconnect layers 102 stacked apart from each other in the Z direction. The contact plug CP1 is not electrically coupled to any other interconnect layers 102 except the one interconnect layer 102. In the example of FIG. 5, seven contact plugs CP1 are provided in one CP1 region. The seven contact plugs CP1 are coupled to the respective seven interconnect layers 102 stacked spaced apart from each other in the Z direction. Hereinafter, when specifying the contact plugs CP1 coupled to the interconnect layers 102 corresponding to the word lines WL0, WL1, WL2, WL3, and WL4, they are referred to as contact plugs CP1_$w$0, CP1_$w$1, CP1_$w$2, CP1_$w$3, and CP1_$w$4, respectively. When specifying the contact plugs CP1 coupled to the interconnect layers 102 corresponding to the selection gate lines SGD and SGS, they are referred to as the contact plugs CP1_$d$ and CP1_$s$, respectively. In the example of FIG. 5, the contact plugs CP1_$s$, CP1_$w$0, CP1_$w$1, CP1_$w$2, CP1_$w$3, CP1_$w$4, and CP1_$d$ are arranged in this order from an end of the memory cell array 11_2 in the X direction toward the cell portion. Note that the arrangement of the contact plugs CP1 in each CP1 region is freely set. For example, the contact plugs CP1 may be arranged in two rows along the X direction.

Interconnect layers 111 are provided on the contact plugs CP1. The interconnect layer 111 extends from a coupling position with the contact plug CP1 to the block BLK adjacent in the Y direction. More specifically, the interconnect layer 111 provided on the contact plug CP1 of the block BLK0_2 extends to the block BLK1_2. The interconnect layer 111 provided on the contact plug CP1 of the block BLK1_2 extends to the block BLK0_2. The interconnect layer 111 provided on the contact plug CP1 of the block BLK2_2 extends to the block BLK3_2. The interconnect layer 111 provided on the contact plug CP1 of the block BLK3_2 extends to the block BLK2_2.

Electrode pads PD are provided on the interconnect layers 111. One end of the interconnect layer 111 is coupled to the contact plug CP1, and the other end of the interconnect layer 111 is electrically coupled to the electrode pad PD. The electrode pad PD is used for electrical coupling with another chip.

Next, the planar configuration of the memory cell array 11_1 will be described. Hereinafter, differences from the planar configuration of the memory cell array 11_2 will be mainly described.

As illustrated in FIG. 6, the configuration of the cell portion is similar to that in the memory cell array 11_2. A plurality of bit lines BLa are arranged side by side in the X direction above the memory pillars MP. The bit line BLa extends in the Y direction. The memory pillars MP of each block BLK are each electrically coupled to any of the bit lines BLa.

The WLSG coupling portion of the memory cell array 11_1 includes CP1 regions and CP2 regions.

The configuration of the CP1 region is similar to that in the memory cell array 11_2. For example, the CP1 regions of the memory cell array 11_1 are arranged above the CP1 regions of the memory cell array 11_2 in the Z direction.

The CP2 region is a region in which a plurality of contact plugs CP2 are provided. For example, the contact plugs CP2 of the memory cell array 11_1 are arranged above the electrode pads PD electrically coupled to the contact plugs CP1 of the memory cell array 11_2 in the Z direction. The contact plug CP2 extends in the Z direction. The contact plug CP2 penetrates the memory cell array 11_1. The contact plug CP2 is not electrically coupled to the interconnect layers 102 of the memory cell array 11_1. The contact plug CP2 is electrically coupled with the contact plug CP1 of the memory cell array 11_2 via the electrode pads PD and the interconnect layer 111 of the array chip 10_2 described in FIG. 5.

More specifically, for example, the contact plug CP2 of the block BLK0_1 is electrically coupled to the contact plug CP1 of the block BLK1_2 of the memory cell array 11_2. The contact plug CP2 of the block BLK1_1 is electrically coupled to the contact plug CP1 of the block BLK0_2 of the memory cell array 11_2. The contact plug CP2 of the block BLK2_1 is electrically coupled to the contact plug CP1 of the block BLK3_2 of the memory cell array 11_2. The contact plug CP2 of the block BLK3_1 is electrically coupled to the contact plug CP1 of the block BLK2_2 of the memory cell array 11_2.

In the example of FIG. 6, seven contact plugs CP2 are provided in one CP2 region. The seven contact plugs CP2 correspond to the respective seven contact plugs CP1 of the memory cell array 11_2. Hereinafter, when specifying the contact plugs CP2 coupled to the contact plugs CP1_$w$0, CP1_$w$1, CP1_$w$2, CP1_$w$3, and CP1_$w$4 of the memory cell array 11_2, they are referred to as contact plugs CP2_$w$0, CP2_$w$1, CP2_$w$2, CP2_$w$3, and CP2_$w$4, respectively. When specifying the contact plugs CP2 coupled to the contact plugs CP1_$d$ and CP1_$s$ of the memory cell array 11_2, they are referred to as contact plugs CP2_$d$ and CP2_$s$, respectively.

Interconnect layers 111 are provided on the contact plugs CP1 and CP2. The contact plugs CP1_$w$0 to CP1_$w$4, and CP1_$d$ and CP1_$s$ are respectively coupled to the contact plugs CP2_$w$0 to CP2_$w$4, and CP2_$d$ and CP2_$s$ of the adjacent block BLK via the interconnect layers 111.

More specifically, for example, the contact plugs CP1 of the block BLK0_1 are electrically coupled with the contact plugs CP2 of the block BLK1_1. The contact plugs CP1 of the block BLK1_1 are electrically coupled with the contact plugs CP2 of the block BLK0_1. The contact plugs CP1 of the block BLK2_1 are electrically coupled with the contact plugs CP2 of the block BLK3_1. The contact plugs CP1 of the block BLK3_1 are electrically coupled with the contact plugs CP2 of the block BLK2_1.

That is, the word lines WLa0 to WLa4, and the selection gate lines SGDa and SGSa of the block BLK0_1 are electrically coupled to the word lines WLa0 to WLa4, and the selection gate lines SGDa and SGSa of the block BLK0_2, respectively. The same applies to other blocks BLK.

Similarly to the memory cell array 11_2, electrode pads PD are provided on the interconnect layers 111 above the memory cell array 11_1.

1.6 Cross-Sectional Configuration of Memory Cell Array

Next, the cross-sectional configuration of the memory cell array 11 will be described.

1.6.1 Configuration of A1-A2 Cross Section

First, an example of the configuration of an A1-A2 cross section of the semiconductor memory device 1 will be described with reference to FIG. 7. FIG. 7 is a cross-sectional view taken along line A1-A2 in FIGS. 5 and 6. The example of FIG. 7 illustrates the memory cell arrays 11_1 and 11_2, and the same applies to the memory cell arrays 11_3 and 11_4.

As illustrated in FIG. 7, the semiconductor memory device 1 has a configuration in which the array chips 10_1 and 10_2 and the circuit chip 20 are bonded. The chips are electrically coupled to each other via the electrode pads PD provided in each of the chips.

First, the internal configuration of the array chip 10_1 will be described.

The array chip 10_1 includes the memory cell array 11_1 and various interconnect layers for coupling to another chip.

The array chip 10_1 includes an insulating layers 101, 105, 107, 110, 112, and 114, interconnect layers 102, 103, 104, and 111, and conductors 106, 108, 109, 113, and 115.

In the memory cell array 11_1, a plurality of insulating layers 101 and a plurality of interconnect layers 102 are alternately stacked one by one. In the example of FIG. 7, seven interconnect layers 102 that function as the selection gate line SGSa, the word lines WLa0 to WLa4, and the selection gate line SGDa are stacked in this order in the Z1 direction. Hereinafter, when specifying the interconnect layers 102 functioning as the word lines WL0, WL1, WL2, WL3, and WL4, they are referred to as interconnect layers 102_w0, 102_w1, 102_w2, 102_w3, and 102_w4, respectively. When specifying the interconnect layers 102 functioning as the selection gate lines SGD and SGS, they are referred to as interconnect layers 102_d and 102_s, respectively.

The insulating layer 101 may contain, for example, silicon oxide (SiO). The interconnect layer 102 contains a conductive material. The conductive material may include a metal material, an n-type semiconductor, or a p-type semiconductor. As the conductive material of the interconnect layer 102, for example, a stacked structure of titanium nitride (TiN)/tungsten (W) is used. In this case, TiN is formed so as to cover W. Note that the interconnect layer 102 may contain a high dielectric constant material such as aluminum oxide (AlO). In this case, the high dielectric constant material is formed so as to cover the conductive material.

The plurality of interconnect layers 102 are separated for each block BLK by the slits SLT extending in the X direction. The slit SLT is filled with the insulating layer 105. The insulating layer 105 may contain SiO.

The interconnect layer 103 is provided above the interconnect layer 102_s in the Z2 direction. The insulating layer 101 is provided between the interconnect layer 102_s and the interconnect layer 103. The interconnect layer 103 functions as (is included in) the source line SL. The interconnect layer 104 is provided on the interconnect layer 103 in the Z2 direction. The interconnect layer 104 is used as an interconnect layer for electrically coupling the interconnect layer 103 to another chip. The interconnect layers 103 and 104 may contain a conductive material. The conductive material may include a metal material, an n-type semiconductor, or a p-type semiconductor.

The contact plug CP1 is provided on each interconnect layer 102 in the Z1 direction. The contact plug CP1 has, for example, a columnar shape. The contact plug CP1 includes the conductor 106 and the insulating layer 107. The conductor 106 has, for example, a columnar shape. One end of the conductor 106 is in contact with the interconnect layer 102. The insulating layer 107 is provided so as to cover a side surface (outer periphery) of the conductor 106. The insulating layer 107 has, for example, a cylindrical shape. The side surface of the conductor 106 is not electrically coupled with other interconnect layers 102 by the insulating layer 107. The conductor 106 may contain a metal material containing W, copper (Cu), aluminum (Al), or the like. The insulating layer 107 may contain SiO.

In the example of FIG. 7, the contact plug CP1_w4 is provided. The contact plug CP1_w4 penetrates the interconnect layer 102_d. The contact plug CP1_w4 is electrically coupled with the interconnect layer 102_w4.

The contact plug CP2 that penetrates the plurality of interconnect layers 102 is provided. The contact plug CP2 has, for example, a columnar shape. The contact plug CP2 includes the conductor 109 and the insulating layer 110. The conductor 109 has, for example, a columnar shape. The insulating layer 110 is provided so as to cover a side surface (outer periphery) of the conductor 109. The insulating layer 110 has, for example, a cylindrical shape. The conductor 109 is not electrically coupled with the interconnect layers 102 by the insulating layer 110.

The interconnect layer 103 and the interconnect layer 104 are not provided in the CP2 regions in which the contact plugs CP2 are provided. The conductor 108 is provided above the interconnect layer 102_s in the Z2 direction. The insulating layer 101 is provided between the interconnect layer 102 and the conductor 108. The conductor 108 is in contact with (electrically coupled to) one end of the contact plug CP2.

The interconnect layer 111 is provided above the interconnect layer 102_d in the Z1 direction. The interconnect layer 111 extends in the Y direction. The insulating layer 101 is provided between the interconnect layer 102 and the interconnect layer 111. The interconnect layer 111 contains a conductive material. The conductive material may include a metal material containing Cu, Al, or the like.

The other end of the contact plug CP1 and the other end of the contact plug CP2 provided to the block BLK adjacent in the Y direction are (electrically) coupled to the interconnect layer 111. The contact plugs CP1 and CP2 coupled to the interconnect layer 111 are arranged side by side along the Y direction. In the example of FIG. 7, the contact plug CP1_w4 of the block BLK0_1 and the contact plug CP2_w4 of the block BLK1_1 are coupled to the interconnect layer 111 arranged so as to straddle the blocks BLK0_1 and BLK1_1. In addition, the contact plug CP1_w4 of the block BLK2_1 and the contact plug CP2_w4 of the block BLK3_1 are coupled to the interconnect layer 111 arranged so as to straddle the blocks BLK2_1 and BLK3_1.

The insulating layer 112 is provided on the interconnect layers 111 and the insulating layer 101 in the Z1 direction. The insulating layer 112 may contain SiO.

A plurality of conductors 113 are provided in the insulating layer 112. The conductor 113 functions as an electrode pad PD. For example, one conductor 113 is provided on one interconnect layer 111. The conductor 113 may contain a metal material containing Cu.

The insulating layer 114 is provided on the interconnect layers 104, the insulating layer 101, and the conductors 108 in the Z2 direction. The insulating layer 114 may contain SiO.

A plurality of conductors 115 are provided in the insulating layer 114. The conductor 115 functions as an electrode pad PD. For example, one conductor 115 is provided on one conductor 108. The conductor 115 may contain a metal material containing Cu.

Next, the internal configuration of the array chip 10_2 will be described. Hereinafter, differences from the array chip 10_1 will be mainly described.

In the array chip 10_2, the contact plugs CP2, the conductors 108, the insulating layer 114, and the conductors 115 described in the configuration of the array chip 10_1 are eliminated. Other configurations are similar to those of the array chip 10_1. The conductors 113 of the array chip 10_2 are coupled to the conductors 115 of the array chip 10_1.

For example, the interconnect layer 102 of the memory cell array 11_2 is electrically coupled to the interconnect layer 102 of the memory cell array 11_1 via the contact plug CP1 of the array chip 10_2, the interconnect layer 111 of the array chip 10_2, the conductor 113 of the array chip 10_2, the conductor 115 of the array chip 10_1, the conductor 108 of the array chip 10_1, the contact plug CP2 of the array chip 10_1, the interconnect layer 111 of the array chip 10_1, and the contact plug CP1 of the array chip 10_1.

In the example of FIG. 7, the interconnect layer 102_w4 of the block BLK0_2 of the memory cell array 11_2 and the interconnect layer 102_w4 of the block BLK0_1 of the memory cell array 11_1 are electrically coupled. In other words, the word line WLa4 of the memory cell array 11_2 and the word line WLa4 of the memory cell array 11_1 arranged above in the Z1 direction are electrically coupled. In this case, the contact plug CP1_w4 of the memory cell array 11_2 and the contact plug CP1_w4 of the memory cell array 11_1 arranged above in the Z1 direction are electrically coupled. The same applies to other word lines WL. Note that the contact plugs CP2 and the conductors 108 may be provided in the memory cell array 11_2.

Next, the circuit chip 20 will be described.

The circuit chip 20 includes a plurality of transistors Tr and various interconnect layers. The plurality of transistor Tr are used for the sequencer 21, the voltage generator 22, the row decoders 23, the sense amplifiers 24, and the like.

More specifically, the circuit chip 20 includes insulating layers 201, 202, and 209, gate electrodes 203, conductors 204, 206, 208, and 210, and interconnect layers 205 and 207.

Element isolation regions are provided in the vicinity of a surface of the semiconductor substrate 200. The element isolation region electrically isolates an n-type well region and a p-type well region provided in the vicinity of the surface of the semiconductor substrate 200, for example. The element isolation region is filled with the insulating layer 201. The insulating layer 201 may contain SiO.

The insulating layer 202 is provided on the semiconductor substrate 200. The insulating layer 202 may contain SiO.

The transistor Tr includes a gate insulating film (not illustrated) provided on the semiconductor substrate 200, the gate electrode 203 provided on the gate insulating film, and a source and a drain (not illustrated) formed in the semiconductor substrate 200. The source and the drain are each electrically coupled to the interconnect layer 205 via the conductor 204. The conductor 204 extends in the Z2 direction. The conductor 204 functions as a contact plug. The conductor 206 is provided on the interconnect layer 205. The conductor 206 extends in the Z2 direction. The conductor 206 functions as a contact plug. The interconnect layer 207 is provided on the conductor 206. The conductor 208 is provided on the interconnect layer 207. The conductor 208 extends in the Z2 direction. Note that the number of interconnect layers provided in the circuit chip 20 is freely set. The conductor 208 functions as a contact plug. The interconnect layers 205 and 207 are made of a conductive material. The conductors 204, 206, and 208, and the interconnect layers 205 and 207 may contain a metal material, a p-type semiconductor, or an n-type semiconductor.

The insulating layer 209 is provided on the insulating layer 202 in the Z2 direction. The insulating layer 209 may contain SiO.

A plurality of conductors 210 are provided in the insulating layer 209. The conductor 210 functions as an electrode pad PD. For example, one conductor 210 is provided on one conductor 208. The conductor 210 may contain a metal material such as Cu. The conductor 210 of the circuit chip 20 is in contact with (electrically coupled to) the conductor 113 of the array chip 10_1.

1.6.2 Configuration of B1-B2 Cross Section

Figure 8:
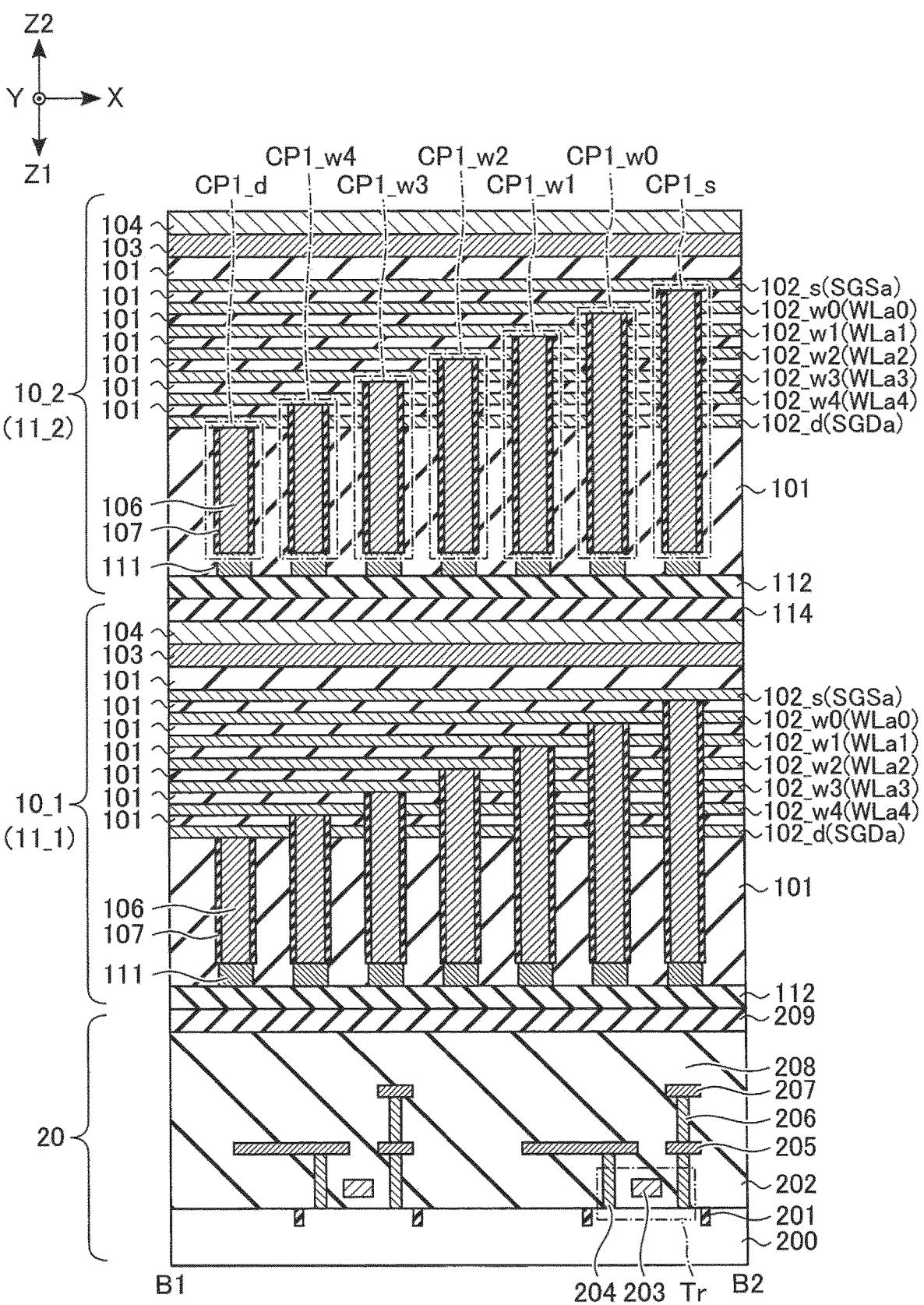
FIG. 8 is a cross-sectional view taken along line B1-B2 in FIGS. 5 and 6.

Next, an example of the configuration of a B1-B2 cross section of the semiconductor memory device 1 will be described with reference to FIG. 8. FIG. 8 is a cross-sectional view taken along line B1-B2 in FIGS. 5 and 6. Hereinafter, description will be given focusing on the configurations of the contact plugs CP1.

As illustrated in FIG. 8, the contact plugs CP1_s, CP1_w0 to CP1_w4, and CP1_d are provided in each of the memory cell arrays 11_1 and 11_2. In the example of FIG. 8, the contact plugs CP1_s, CP1_w0 to CP1_w4, and CP1_d are arranged in this order from the right side toward the left side in the drawing. One ends of the contact plugs CP1_s, CP1_w0 to CP1_w4, and CP1_d are in contact with (electrically coupled to) the interconnect layers 102_s, 102_w0 to 102_w4, and 102_d, respectively. In addition, the other ends of the contact plugs CP1_s, CP1_w0 to CP1_w4, and CP1_d are in contact with (electrically coupled to) different interconnect layers 111. Therefore, lengths of the contact plugs CP1_S, CP1_w0 to CP1_w4, and CP1_d in the Z direction are different from each other.

More specifically, the contact plug CP1_s penetrates six interconnect layers 102_w0 to 102_w4, and 102_d. The contact plug CP1_s is not electrically coupled to the six interconnect layers 102_w0 to 102_w4 and 102_d. One end of the contact plug CP1_s is electrically coupled to the interconnect layer 102_s.

The contact plug CP1_w0 penetrates five interconnect layers 102_w1 to 102_w4 and 102_d. The contact plug CP1_w0 is not electrically coupled to the five interconnect layers 102_w1 to 102_w4 and 102_d. One end of the contact plug CP1_w0 is electrically coupled to the interconnect layer 102_w0.

The contact plug CP1_w1 penetrates four interconnect layers 102_w2 to 102_w4 and 102_d. The contact plug CP1_w1 is not electrically coupled to the four interconnect layers 102_w2 to 102_w4 and 102_d. One end of the contact plug CP1_w1 is electrically coupled to the interconnect layer 102_w1.

The contact plug CP1_w2 penetrates three interconnect layers 102_w3, 102_w4, and 102_d. The contact plug CP1_w2 is not electrically coupled to the three interconnect layers 102_w3, 102_w4, and 102_d. One end of the contact plug CP1_w2 is electrically coupled to the interconnect layer 102_w2.

The contact plug CP1_w3 penetrates two interconnect layers 102_w4 and 102_d. The contact plug CP1_w3 is not electrically coupled to the two interconnect layers 102_w4 and 102_d. One end of the contact plug CP1_w3 is electrically coupled to the interconnect layer 102_w3.

The contact plug CP1_w4 penetrates the interconnect layer 102_d. The contact plug CP1_w4 is not electrically coupled to the interconnect layer 102_d. One end of the contact plug CP1_w4 is electrically coupled to the interconnect layer 102_w4.

One end of the contact plug CP1_d is electrically coupled to the interconnect layer 102_d.

1.6.3 Configuration of C1-C2 Cross Section

Figure 9:
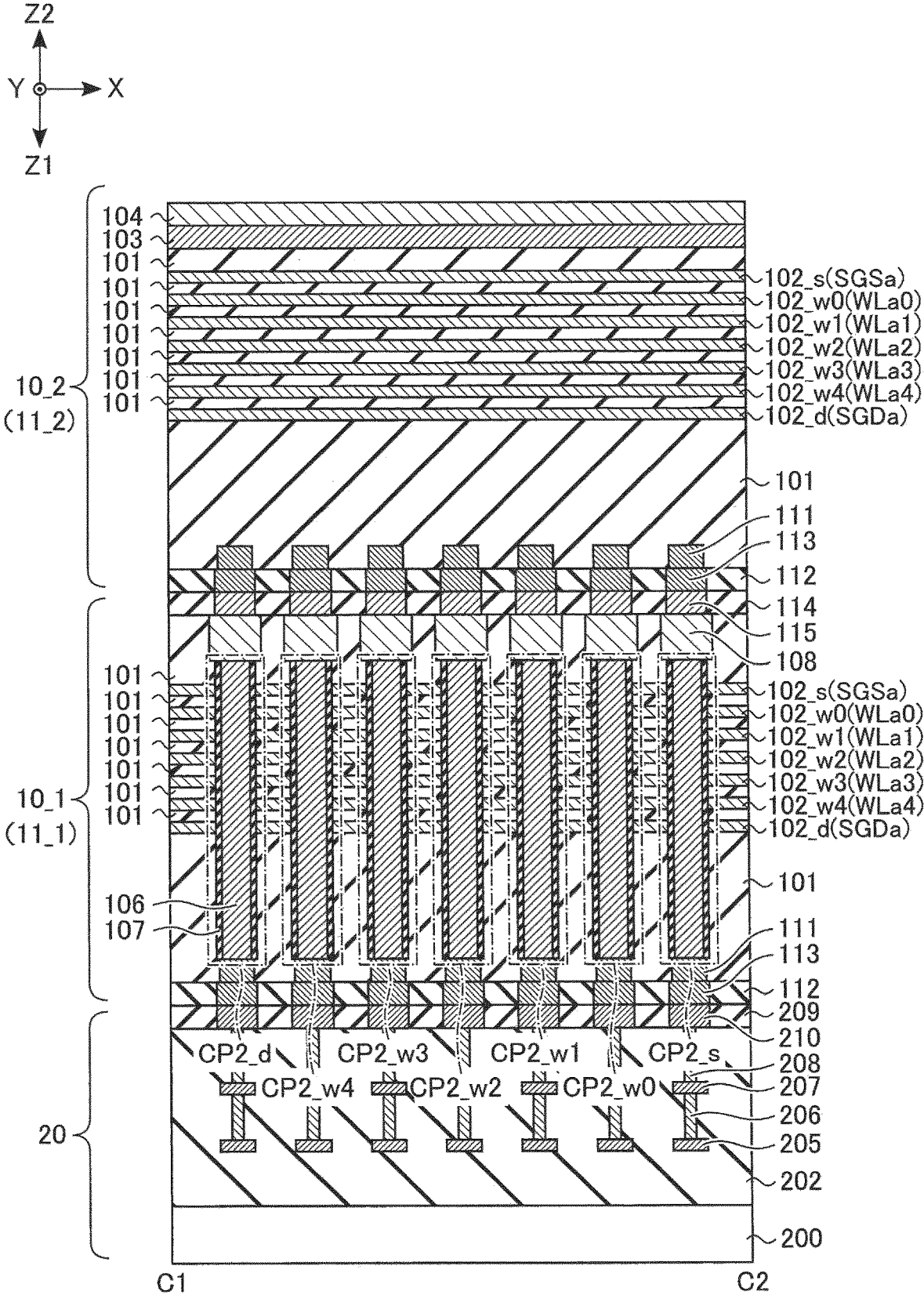
FIG. 9 is a cross-sectional view taken along line C1-C2 in FIGS. 5 and 6.

Next, an example of the configuration of a C1-C2 cross section of the semiconductor memory device 1 will be described with reference to FIG. 9. FIG. 9 is a cross-sectional view taken along line C1-C2 in FIGS. 5 and 6. Hereinafter, description will be given focusing on the configurations of the contact plugs CP2.

As illustrated in FIG. 9, the contact plugs CP2_s, CP2_w0 to CP2_w4, and CP2_d are provided in the array chip 10_1. In the example of FIG. 9, the contact plugs CP2_s, CP2_w0 to CP2_w4, and CP2_d are arranged in this order from the right side toward the left side in the drawing. The contact plugs CP2_s, CP2_w0 to CP2_w4, and CP2_d have substantially the same shape (the same length). The contact plugs CP2_$s$, CP2_$w$0 to CP2_$w$4, and CP2_$d$ penetrate seven interconnect layers 102_$s$, 102_$w$0 to 102_$w$4, and 102_$d$. The contact plugs CP2_$s$, CP2_$w$0 to CP2_$w$4, and CP2_$d$ are not electrically coupled to the seven interconnect layers 102_$s$, 102_$w$0 to 102_$w$4, and 102_$d$. One ends of the contact plugs CP2_$s$, CP2_$w$0 to CP2_$w$4, and CP2_$d$ are coupled to different conductors 108. The other ends of the contact plugs CP2_$s$, CP2_$w$0 to CP2_$w$4, and CP2_$d$ are coupled to different interconnect layers 111.

1.6.4 Configuration of D1-D2 Cross Section

Next, an example of the configuration of a D1-D2 cross section of the semiconductor memory device 1 will be described with reference to FIG. 10. FIG. 10 is a cross-sectional view taken along line D1-D2 in FIGS. 5 and 6. Hereinafter, description will be given focusing on the configurations of the memory pillar MP and the bit line BL.

As illustrated in FIG. 10, the memory pillars MP are provided in the array chips 10_1 and 10_2.

The memory pillar MP penetrates the plurality of interconnect layers 102. The memory pillar MP extends in the Z direction. One end of the memory pillar MP is in contact with the interconnect layer 103. A conductor 126 is provided on the other end of the memory pillar MP in the Z1 direction. For example, the conductor 126 has a substantially columnar shape. The conductor 126 functions as a contact plug CP3. A conductor 127 is provided on the conductor 126. For example, the conductor 127 has a substantially columnar shape. The conductor 127 functions as a contact plug CP4. A plurality of interconnect layers 128 are provided above the memory pillars MP in the Z1 direction. The plurality of interconnect layers 128 are arranged side by side in the X direction. The interconnect layer 128 extends in the Y direction. The interconnect layer 128 functions as the bit line BL. The interconnect layer 128 is electrically coupled to any of the memory pillars MP via the contact plugs CP3 and CP4.

The conductor 126 and 127, and the interconnect layer 128 may contain a metal material such as W, Al, Cu, or the like.

Next, the internal configuration of the memory pillar MP will be described.

The memory pillar MP includes a block insulating film 120, a charge storage layer 121, a tunnel insulating film 122, a semiconductor layer 123, a core layer 124, and a cap layer 125.

More specifically, a hole MH that penetrates the plurality of interconnect layers 102 is formed. The hole MH corresponds to the memory pillar MP. An end of the hole MH in the Z2 direction reaches the interconnect layer 103. On a side surface of the hole MH, the block insulating film 120, the charge storage layer 121, and the tunnel insulating film 122 are stacked in this order from the outside. For example, when the hole MH has a cylindrical shape, the block insulating film 120, the charge storage layer 121, and the tunnel insulating film 122 each have a cylindrical shape. The semiconductor layer 123 is provided so as to be in contact with a side surface of the tunnel insulating film 122. An end of the semiconductor layer 123 in the Z2 direction is in contact with the interconnect layer 103. The semiconductor layer 123 is a region in which channels of the memory cell transistors MC and the selection transistors ST1 and ST2 are formed. Therefore, the semiconductor layer 123 functions as a signal line that couples the current paths of the selection transistor ST2, the memory cell transistors MC0 to MC4, and the selection transistor ST1.

The semiconductor layer 123 is filled with the core layer 124. A cap layer 125, a side surface of which is in contact with the tunnel insulating film 122, is provided on ends of the semiconductor layer 123 and the core layer 124 in the Z1 direction. That is, the memory pillar MP includes the semiconductor layer 123 that passes through the plurality of interconnect layers 102 and extends in the Z direction.

The block insulating film 120, the tunnel insulating film 122, and the core layer 124 may contain SiO. The charge storage layer 121 may contain silicon nitride (SiN). The semiconductor layer 123 and the cap layer 125 may contain, for example, polysilicon.

The memory cell transistors MC0 to MC4 are configured by combining the memory pillars MP and the respective interconnect layers 102_$w$0 to 102_$w$4. Similarly, the selection transistor ST1 is configured by combining the memory pillar MP and the interconnect layer 102_$d$. The selection transistor ST2 is configured by combining the memory pillar MP and the interconnect layer 102_$s$.

1.7 Planar Configuration of BL Coupling Portion

Next, an example of the configuration of the BL coupling portion will be described with reference to FIG. 11. FIG. 11 is a plan view of the BL coupling portion of the array chip 10_2. The example of FIG. 11 illustrates four bit lines BLb0 to BLb3 coupled to the memory cell array 11_2, and four bit lines BLa0 to BLa3 coupled to the memory cell array 11_4. Note that the insulating layers are omitted.

Hereinafter, when specifying the interconnect layers 128 and 132, and the conductors 113, 131, and 133 corresponding to the bit lines BLa, they are referred to as interconnect layers 128$a$ and 132$a$, and conductors 113$a$, 131$a$, and 133$a$, respectively. In addition, when specifying the interconnect layers 128 and 132, and the conductors 113, 131, and 133 corresponding to the bit lines BLb, they are referred to as interconnect layers 128$b$ and 132$b$, and conductors 113$b$, 131$b$, and 133$b$, respectively.

As illustrated in FIG. 11, the interconnect layers 128$a$ that function as the bit lines BLa0 to BLa3 are arranged side by side in the X direction. Similarly, the interconnect layers 128$b$ that function as the bit lines BLb0 to BLb3 are arranged side by side in the X direction. Each of the interconnect layers 128$a$ and 128$b$ extends in the Y direction. In the example of FIG. 11, the bit lines BLa and the bit lines BLb are arranged so as to face each other in the Y direction.

The conductor 131 is coupled to an end of each interconnect layer 128. The conductor 131 has a substantially columnar shape and extends in the Z direction. One end of the conductor 131 is coupled to the interconnect layer 128, and the other end of the conductor 131 is coupled to the interconnect layer 132. The conductor 131 functions as a contact plug CP6 that couples the interconnect layer 128 and the interconnect layer 132. The interconnect layer 132 is provided in a layer different from the interconnect layer 128. The shape of the interconnect layer 132 differs depending on the interconnect layer 128 electrically coupled to the interconnect layer 132. The shape of the interconnect layer 132 will be described later. The conductor 133 is coupled to an end of the interconnect layer 132. The conductor 133 has a substantially columnar shape and extends in the Z direction. One end of the conductor 133 is coupled to the interconnect layer 132, and the other end of the conductor 133 is coupled to the conductor 113. The conductor 133 functions as a contact plug CP7 that couples the interconnect layer 132 and the conductor 113.

The conductors 131 and 133, and the interconnect layer 132 may contain a metal material such as W, Al, Cu, or the like.

Next, an example of the shape of the interconnect layer 132 will be described.

The interconnect layers 128*a* of the array chip 10_2 are electrically coupled to the memory cell array 11_1 of the array chip 10_1. In addition, the interconnect layers 128*b* of the array chip 10_2 are electrically coupled to the memory cell array 11_3 of the array chip 10_1. Therefore, for example, the conductors 113*a* electrically coupled to the interconnect layers 128*a* are arranged on a side closer to the memory cell array 11_2 than the conductors 113*b* electrically coupled to the interconnect layers 128*b*. In such a case, for example, the interconnect layer 132*b* electrically coupled to the interconnect layer 128*b* extends in the Y direction. On the other hand, the interconnect layer 132*a* electrically coupled to the interconnect layer 128*a* is formed in a shape so as to bypass the interconnect layer 132*b*, for example. More specifically, for example, the interconnect layer 132*a* includes three interconnect portions 132*a*1 to 132*a*3. The interconnect portion 132*a*1 extends in the X direction. One end of the interconnect portion 132*a*1 is coupled to the interconnect layer 128*a* via the conductor 131*a*, and the other end of the interconnect portion 132*a*1 is coupled to one end of the interconnect portion 132*a*2. The interconnect portion 132*a*2 extends in the Y direction. The other end of the interconnect portion 132*a*2 is coupled to one end of the interconnect portion 132*a*3. The interconnect portion 132*a*3 extends in the X direction. The other end of the interconnect portion 132*a*3 is coupled to the conductor 113*a* via the conductor 133*a*.

In the example of FIG. 11, the interconnect layer 132*a* corresponding to the bit line BLa0 is arranged so as to protrude downward in the drawing and bypass the interconnect layer 132*b* corresponding to the bit line BLb0. The interconnect layer 132*a* corresponding to the bit line BLa1 is arranged so as to protrude upward in the drawing and bypass the interconnect layer 132*b* corresponding to the bit line BLb1 so as to face the interconnect layer 132*a* corresponding to the bit line BLa0. The interconnect layers 132*a* corresponding to the bit lines BLa2 and BLa3 and the interconnect layers 132*b* corresponding to the bit lines BLb2 and BLb3 also have the same shapes as described above. The interconnect layers 132*a* corresponding to the bit lines BLa2 and BLa3 and the interconnect layers 132*b* corresponding to the bit lines BLb2 and BLb3 are arranged at positions different from the interconnect layers 132*a* corresponding to the bit lines BLa0 and BLa1 and the interconnect layers 132*b* corresponding to the bit lines BLb0 and BLb1 in the Y direction.

1.8 BL Cross-Sectional Configuration of Coupling Portion

Figure 12:
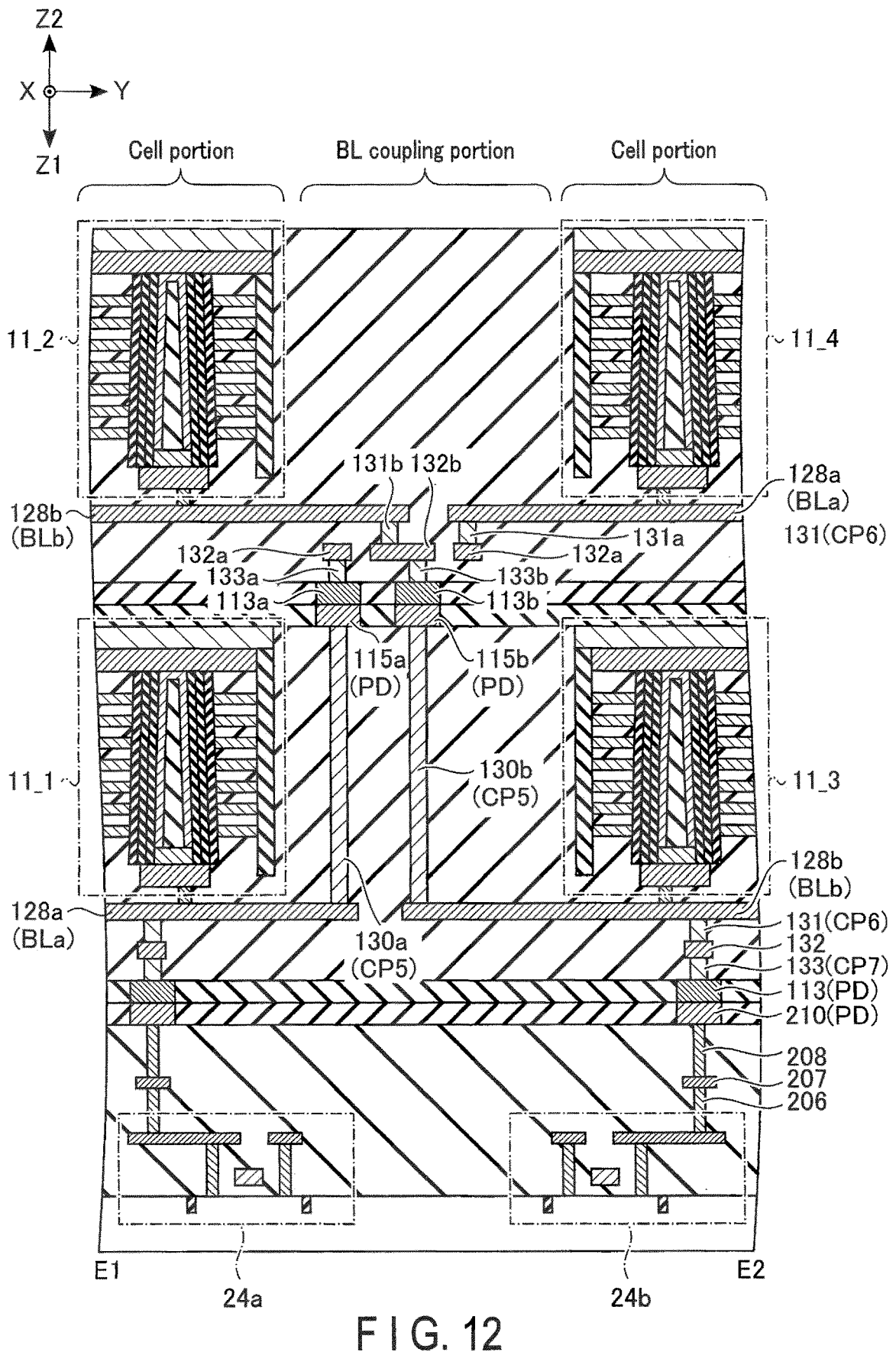
FIG. 12 is a cross-sectional view taken along line E1-E2 in FIG. 11.

Next, an example of the cross-sectional configuration of the BL coupling portion will be described with reference to FIG. 12. FIG. 12 is a cross-sectional view taken along line E1-E2 in FIG. 11. Hereinafter, description will be given focusing on the coupling between the bit lines BL between the memory cell arrays 11.

Hereinafter, when specifying the conductors 115 and conductors 130 corresponding to the bit lines BLa, they are referred to as conductors 115*a* and 130*a*, respectively. In addition, when specifying the conductors 115 and 130 corresponding to the bit lines BLb, they are referred to as conductors 115*b* and 130*b*, respectively.

As illustrated in FIG. 12, in the BL coupling portion of the array chip 10_1, one ends of the interconnect layers 128 are coupled to the conductors 115 via the conductors 130 extending in the Z2 direction. For example, the conductor 130 has a substantially columnar shape. The conductor 130 functions as a contact plug CP5. In addition, in the cell portion, the conductor 131 is provided on the interconnect layer 128 in the Z1 direction. The interconnect layer 132 is provided on the conductor 131 in the Z1 direction. The interconnect layer 132 is coupled to the conductor 113 via the conductor 133.

The conductor 130 may contain a metal material such as W, Al, Cu, or the like.

In the BL coupling portion of the array chip 10_2, the conductors 131 are provided on the interconnect layers 128 in the Z1 direction. The interconnect layers 132 are provided on the conductors 131. The interconnect layer 132 is coupled to the conductor 113 via the conductor 133.

More specifically, for example, the interconnect layer 128*b* (bit line BLb) corresponding to the memory cell array 11_2 is coupled to the interconnect layer 128*b* (bit line BLb) corresponding to the memory cell array 11_3 via the conductor 131*b*, the interconnect layer 132*b*, the conductor 133*b*, the conductor 113*b*, the conductor 115*b*, and the conductor 130*b*. The interconnect layer 128*b* (bit line BLb) corresponding to the memory cell array 11_3 is electrically coupled to the sense amplifier 24*b* of the circuit chip 20. Similarly, the interconnect layer 128*a* (bit line BLa) of the memory cell array 11_4 is coupled to the interconnect layer 128*a* (bit line BLa) corresponding to the memory cell array 11_1 via the conductor 131*a*, the interconnect layer 132*a*, the conductor 133*a*, the conductor 113*a*, the conductor 115*a*, and the conductor 130*a*. The interconnect layer 128*a* (bit line BLa) corresponding to the memory cell array 11_1 is electrically coupled to the sense amplifier 24*a* of the circuit chip 20.

1.9 Selection of Cell Unit in Write Operation and Read Operation

Next, an example of selection of the cell units CU in the write operation and the read operation will be described with reference to FIGS. 13 and 14. FIG. 13 is a conceptual diagram illustrating a case where the cell units CU of the array unit AUa are selected. FIG. 14 is a conceptual diagram illustrating a case where the cell units CU of the array unit AUb are selected. In FIGS. 13 and 14, a thick solid line indicates a state where voltages are applied to the word line WL and the bit line BL in the write operation or the read operation. In addition, the word line WL indicated by a broken line indicates a state (an off state) where no voltage is applied.

First, a case will be described where the cell units CU of the array unit AUa are selected.

As illustrated in FIG. 13, in the write operation or the read operation, one cell unit CU (memory cell transistors MC) of the memory cell array 11_1 and one cell unit CU (memory cell transistors MC) of the memory cell array 11_2 that are commonly coupled to one word line WLa are simultaneously selected. The sense amplifier 24*a* applies voltages corresponding to the write operation or the read operation to the memory cell array 11_1 via the bit lines BLa. On the other hand, the sense amplifier 24*b* applies voltages corresponding to the write operation or the read operation to the memory cell array 11_2 via the bit lines BLb. In this case, the array unit AUb is not selected and hence, no voltage is applied to the word line WLb.

Next, a case will be described where the cell units CU of the array unit AUb are selected.

As illustrated in FIG. 14, in the write operation or the read operation, one cell unit CU (memory cell transistor MC) of the memory cell array 11_3 and one cell unit CU (memory cell transistors MC) of the memory cell array 11_4 that are commonly coupled to one word line WLb are simultaneously selected. The sense amplifier 24*a* applies voltages corresponding to the write operation or the read operation to the memory cell array 11_4 via the bit lines BLa. On the other hand, the sense amplifier 24b applies voltages corresponding to the write operation or the read operation to the memory cell array 11_3 via the bit lines BLb. In this case, the array unit AUa is not selected and hence, no voltage is applied to the word line WLa.

1.10 Order of Data Writing

Next, an order of data writing will be described with reference to FIG. 15. FIG. 15 is a diagram illustrating a write order of one block BLK of each memory cell array 11. In the example of FIG. 15, one frame in the table corresponds to one cell unit CU. Numbers starting with "a" in the frames indicate a case where the row decoder 23a selects the word line WLa and the selection gate line SGDa, that is, a case where the array unit AUa is selected. Numbers starting with "b" in the frames indicate a case where the row decoder 23b selects the word line WLb and the selection gate line SGDb, that is, a case where the array unit AUb is selected. Note that, in the example of FIG. 15, as an order of selecting the word lines WL, a case is illustrated where the word lines WL are selected in order from the word line WL4 to the word line WL0. However, the word lines WL may be selected in order from the word line WL0 to the word line WL4.

First, the write operation in which the row decoder 23a selects the word lines WLa and the selection gate lines SGDa will be described.

As illustrated in FIG. 15, for example, the row decoder 23a selects the word line WLa4 and the selection gate line SGDa0 as an a1-th write operation. As a result, the memory cell transistor MC4 of the string unit SU0_1 and the memory cell transistor MC4 of the string unit SU0_2 are selected. That is, one cell unit CU of the memory cell arrays 11_1 and one cell unit CU of the memory cell arrays 11_2 are selected. In this state, the sense amplifier 24a applies voltages corresponding to the write data to the memory cell array 11_1 via the bit lines BLa. At the same time, the sense amplifier 24b applies voltages corresponding to the write data to the memory cell array 11_2 via the bit lines BLb.

Next, the row decoder 23a selects the word line WLa4, and selects the selection gate lines SGDa1 to SGDa3 in this order as a2 to a4-th write operations. In the memory cell array 11_1, the memory cell transistors MC4 of the string units SU1_1 to SU3_1 are selected in this order in response to the a2 to a4-th write operations. In the memory cell array 11_2, the memory cell transistors MC4 of the string units SU1_2 to SU3_2 are selected in this order in response to the a2 to a4-th write operations.

Next, the row decoder 23a selects the word line WLa3, and selects the selection gate lines SGDa0 to SGDa3 in this order as a5 to a8-th write operations. In the memory cell array 11_1, the memory cell transistors MC3 of the string units SU0_1 to SU3_1 are selected in this order in response to the a5 to a8-th write operations. In the memory cell array 11_2, the memory cell transistors MC3 of the string units SU0_2 to SU3_2 are selected in this order in response to the a5 to a8-th write operations.

The row decoder 23a selects the word lines WLa and the selection gate lines SGDa in the same order also in a9 to a20-th write operations.

Next, the write operation in which the row decoder 23b selects the word lines WLb and the selection gate lines SGDb will be described.

For example, the row decoder 23b selects the word line WLb4 and the selection gate line SGDb0 as a b1-th write operation. As a result, the memory cell transistor MC4 of the string unit SU0_3 and the memory cell transistor MC4 of the string unit SU0_4 are selected. That is, one cell unit CU of the memory cell arrays 11_3 and one cell unit CU of the memory cell arrays 11_4 are selected. In this state, the sense amplifier 24b applies voltages corresponding to the write data to the memory cell array 11_3 via the bit lines BLb. At the same time, the sense amplifier 24a applies voltages corresponding to the write data to the memory cell array 11_4 via the bit lines BLa.

Next, the row decoder 23b selects the word line WLb4, and selects the selection gate lines SGDb1 to SGDb3 in this order as b2 to b4-th write operations. In the memory cell array 11_3, the memory cell transistors MC4 of the string units SU1_3 to SU3_3 are selected in this order in response to the b2 to b4-th write operations. In the memory cell array 11_4, the memory cell transistors MC4 of the string units SU1_4 to SU3_4 are selected in this order in response to the b2 to b4-th write operations.

The row decoder 23b selects the word lines WLb and the selection gate lines SGDb in the same order as the order by the row decoder 23a also in b5 to b20-th write operations.

1.11 Advantageous Effects According to Present Embodiment

With the configuration according to the present embodiment, it is possible to provide a semiconductor memory device capable of suppressing an increase in the chip area. This advantageous effect will be described in detail.

For example, a method is known in which a plurality of memory cell arrays (array chips) are stacked in order to highly integrate a semiconductor memory device. When word lines WL of each memory cell array are separately coupled to a circuit chip, the number of word lines WL coupled to a row decoder increases. Therefore, the circuit scale of the row decoder increases in accordance with the number of memory cell arrays. In other words, the area of the circuit chip increases.

On the other hand, with the configuration according to the present embodiment, in the plurality of memory cell arrays 11 stacked above the circuit chip 20, the word lines WL can be commonly coupled. Therefore, even when the number of memory cell arrays 11, that is, the number of stacked layers of the word lines WL increases, an increase in the number of word lines WL coupled to the row decoder 23 can be suppressed. As a result, an increase in the area of the circuit chip 20 can be suppressed.

Furthermore, the configuration according to the present embodiment includes a structure in which two sets of array units AU each including two memory cell arrays 11 stacked above the circuit chip 20 are arranged side by side in a direction parallel to the circuit chip 20. The bit lines BL are commonly coupled to one memory cell array 11 of one array unit AU and one memory cell array 11 provided in a different array chip 10 of the other array unit AU. As a result, in the write operation and the read operation, two cell units CU of the two memory cell arrays 11 in the array unit AU can be simultaneously selected. That is, in the write operation and the read operation, page data of each of the two cell units CU can be collectively processed. Therefore, the semiconductor memory device 1 can improve processing capability.

Furthermore, with the configuration according to the present embodiment, two cell units CU can be collectively processed. Accordingly, the size of the block BLK in one memory cell array 11, that is, the data size of one page, can be halved. As a result, the size of the memory cell array 11 can be reduced. Therefore, an increase in the area of the array chip 10 can be suppressed.

Furthermore, with the configuration according to the present embodiment, the bit lines BL can be shared between the array units AU. Therefore, even when the number of stacked memory cell arrays 11 increases, an increase in the number of bit lines BL coupled to the sense amplifier can be suppressed. As a result, an increase in the area of the circuit chip can be suppressed.

Furthermore, the configuration according to the present embodiment can suppress disturbances in the write operation and the read operation. This advantageous effect will be described in detail.

For example, in the write operation and the read operation, when either one of the memory cell arrays 11 of the array unit AU is selected, a voltage is also applied to the word line WL of non-selected memory cell array 11 of the selected array unit AU. Therefore, the non-selected memory cell array 11 is also affected by the disturbance.

On the other hand, with the configuration according to the present embodiment, two memory cell arrays 11 of the array unit AU can be simultaneously selected or deselected. Therefore, in the write operation and the read operation, application of a voltage to the word line WL of the non-selected memory cell arrays 11 can be suppressed. Therefore, the influence of disturbance can be suppressed.

2. Second Embodiment

Next, a second embodiment will be described. In the second embodiment, a layout of memory cell arrays 11 different from that in the first embodiment will be described. Hereinafter, differences from the first embodiment will be mainly described.

2.1 Arrangement of Memory Cell Arrays

Figure 16:
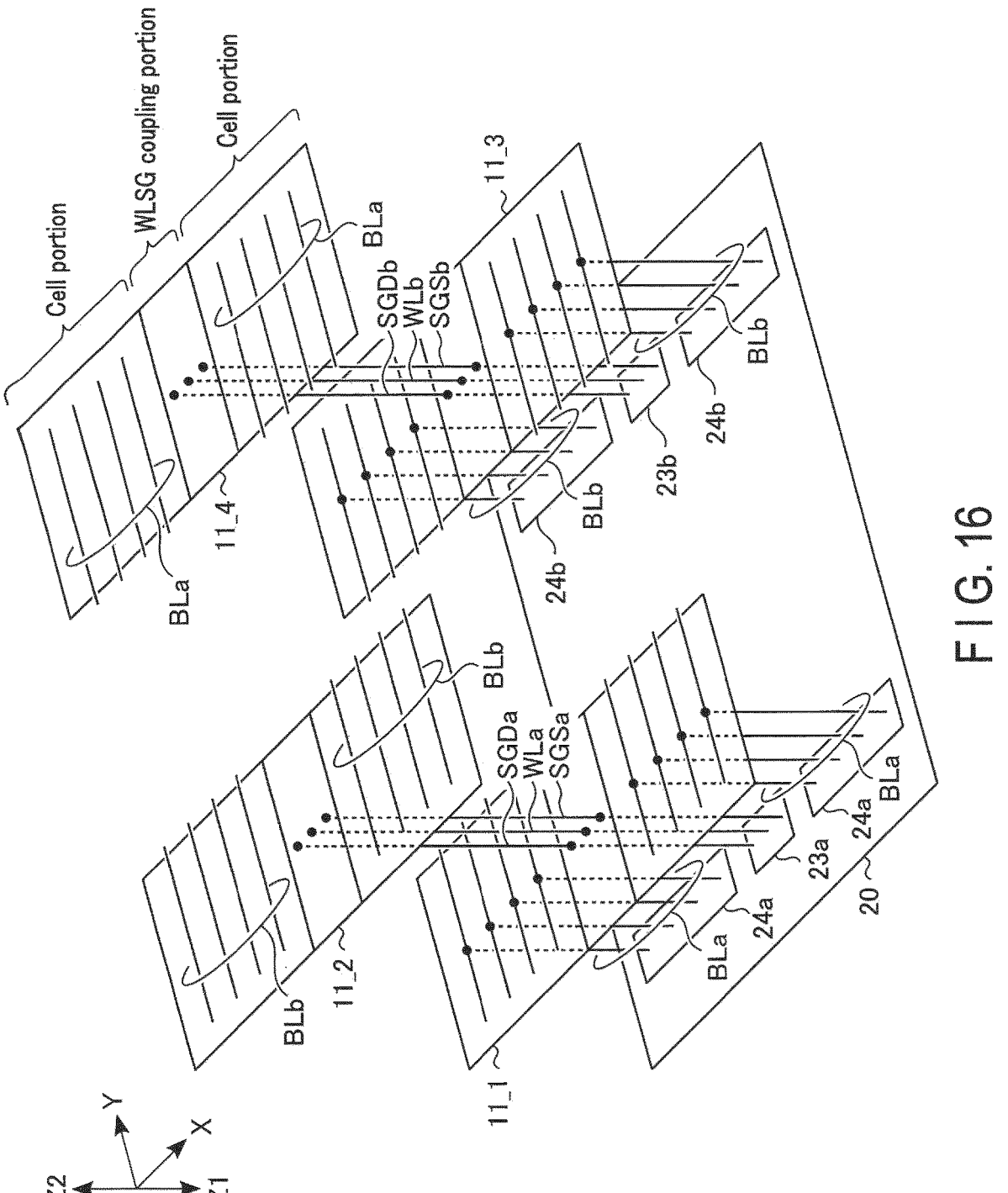
FIG. 16 is a perspective view illustrating an arrangement of memory cell arrays 11_1 to 11_4 and a circuit chip 20 included in a semiconductor memory device according to a second embodiment.

Next, an example of an arrangement of memory cell arrays will be described with reference to FIG. 16. FIG. 16 is a perspective view illustrating the arrangement of memory cell arrays 11_1 to 11_4 and a circuit chip 20. Note that, in the example of FIG. 16, in order to simplify the description, one word line WLa, one word line WLb, one selection gate line SGDa, one selection gate line SGDb, one selection gate line SGSa, and one selection gate line SGSb, and eight bit lines BLa and eight bit lines BLb are illustrated in each memory cell array 11. The source lines SL are omitted. In addition, in order to simplify the description, BL coupling portions are omitted.

As illustrated in FIG. 16, the memory cell array 11 includes two cell portions and one WLSG coupling portion. More specifically, the WLSG coupling portion is provided between the two cell portions arranged side by side in the X direction. That is, the WLSG coupling portion is provided at the center portion of the memory cell array 11. By providing the WLSG coupling portion at the center portion, even when the size of a block BLK (data size of one page) increases, the effective interconnect length of the word line WL from the WLSG coupling portion to an end of the cell portion is reduced. Accordingly, the delay of the voltage propagation in the word line WL can be suppressed. For example, when the data size of one page in the configuration of the first embodiment is 8 KB, in the configuration of the present embodiment, the data size of one page can be 16 KB while the effective interconnect length of the word line WL is maintained at the same level (while the delay of the voltage propagation in the word line WL is suppressed to the same level).

Other configurations are similar to those in FIG. 3. The bit lines BLa of the memory cell array 11_4 are coupled to the bit lines BLa of the memory cell array 11_1. The bit lines BLb of the memory cell array 11_2 are coupled to the bit lines BLb of the memory cell array 11_3.

2.2 Planar Configuration of Memory Cell Array

Next, an example of the configuration of the memory cell array 11 will be described with reference to FIGS. 17 and 18. FIG. 17 is a plan view of the memory cell array 11_2. FIG. 18 is a plan view of the memory cell array 11_1. Note that, in the example of FIGS. 17 and 18, in order to simplify the description, a case will be described where each memory cell array 11 includes four blocks BLK0 to BLK3, and each block BLK includes one string unit SU. In addition, in the example of FIGS. 17 and 18, insulating layers are omitted. The configuration of the memory cell array 11_3 is similar to that of the memory cell array 11_1. The configuration of the memory cell array 11_4 is similar to that of the memory cell array 11_2.

First, the planar configuration of the memory cell array 11_2 will be described.

As illustrated in FIG. 17, four blocks BLK0_2 to BLK3_2 are arranged side by side in the Y direction from the upper side toward the lower side in the drawing.

The cell portions are provided at both ends of the memory cell array 11_2 in the X direction. The configuration of the cell portion is similar to that in the first embodiment. A plurality of bit lines BLb are arranged side by side in the X direction above the memory pillars MP. The bit line BLb extends in the Y direction. The memory pillars MP of each block BLK are each electrically coupled to any of the bit lines BLb.

The WLSG coupling portion is provided at the center portion of the memory cell array 11_2. In other words, the WLSG coupling portion is provided between the two cell portions arranged side by side in the X direction.

The WLSG coupling portion of each block BLK includes a CP1 region. The CP1 region of the block BLK0_2 and the CP1 region of the block BLK1_2 are arranged at different positions in the X direction. In addition, the CP1 region of the block BLK2_2 and the CP1 region of the block BLK3_2 are arranged at different positions in the X direction. In the example of FIG. 17, similar to the first embodiment, seven contact plugs CP1_*s*, CP1_*w*0, CP1_*w*1, CP1_*w*2, CP1_*w*3, CP1_*w*4, and CP1_*d* are arranged in this order in one CP1 region. An interconnect layer 111 is provided on each contact plug CP1. The interconnect layer 111 extends in the Y direction from a coupling position with the contact plug CP1 to the adjacent block BLK. Electrode pads PD are provided on the interconnect layers 111. One end of the interconnect layer 111 is coupled to the contact plug CP1, and the other end of the interconnect layer 111 is electrically coupled to the electrode pad PD. In each block BLK, the relationship of the arrangement between the contact plug CP1, the interconnect layer 111, and the electrode pad PD is the same as that in the first embodiment.

Next, the planar configuration of the memory cell array 11_1 will be described. Hereinafter, differences from the planar configuration of the memory cell array 11_2 will be mainly described.

As illustrated in FIG. 18, the configuration of the cell portion is similar to that in the memory cell array 11_2. A plurality of bit lines BLa are arranged side by side in the X direction above the memory pillars MP. The bit line BLa extends in the Y direction. The memory pillars MP of each block BLK are each electrically coupled to any of the bit lines BLa.

The WLSG coupling portion is provided at the center portion of the memory cell array 11_1.

The WLSG coupling portion of each block BLK includes a CP1 region and a CP2 region.

The configuration of the CP1 region is similar to that in the memory cell array 11_2. For example, the CP1 regions of the memory cell array 11_1 are arranged above the CP1 regions of the memory cell array 11_2 in the Z direction.

The CP2 region of each block BLK is, for example, arranged side by side with the CP1 region in the X direction. Therefore, the CP2 region of the block BLK0_1 and the CP2 region of the BLK1_1 are arranged at different positions in the X direction. In addition, the CP2 region of the block BLK2_1 and the CP2 region of the block BLK3_1 are arranged at different positions in the X direction.

The CP2 region is a region in which a plurality of contact plugs CP2 are provided. The contact plugs CP2 are electrically coupled with the contact plugs CP1 of the memory cell array 11_2 via the electrode pads PD and the interconnect layers 111 of the array chip 10_2 described in FIG. 17.

In the example of FIG. 18, seven contact plugs CP2_s, CP2_w0, CP2_w1, CP2_w2, CP2_w3, CP2_w4, and CP2_d are arranged in this order in one CP2 region. The seven contact plugs CP2 correspond to the respective seven contact plugs CP1 of the memory cell array 11_2.

Interconnect layers 111 are provided on the contact plugs CP1 and CP2. The contact plugs CP1_w0 to CP1_w4, and CP1_d and CP1_s are respectively coupled to the contact plugs CP2_w0 to CP2_w4, and CP2_d and CP2_s of the adjacent block BLK via the interconnect layers 111. Electrode pads PD are provided on the interconnect layers 111 on the memory cell array 11_1.

2.3 Advantageous Effects According to Present Embodiment

With the configuration according to the present embodiment, advantageous effects similar to those of the first embodiment can be obtained.

3. Modifications and the Like

According to above embodiment, a semiconductor memory device includes: a first memory cell array (11_1); a second memory cell array (11_2) arranged above the first memory cell array in a first direction (Z direction); a third memory cell array (11_3) arranged adjacent to the first memory cell array in a second direction (X direction) intersecting with the first direction; a fourth memory cell array (11_4) arranged above the third memory cell array in the first direction and arranged adjacent to the second memory cell array in the second direction; a first word line (WLa) coupled to the first memory cell array and the second memory cell array; a second word line (WLb) coupled to the third memory cell array and the fourth memory cell array; a first bit line (BLa) coupled to the first memory cell array and the fourth memory cell array; and a second bit line (BLb) coupled to the second memory cell array and the third memory cell array.

By applying the above embodiment, it is possible to provide a semiconductor memory device capable of suppressing an increase in the chip area.

Note that the embodiments are not limited to the embodiments described above, and various modifications may be applicable.

For example, in the above embodiments, a case is described where the circuit chip 20 and the two array chips 10_1 and 10_2 are bonded. However, these configurations may be formed on one semiconductor substrate.

Furthermore, the "couple" in the above embodiments includes a state where coupling is indirectly made by interposing, for example, other components such as a transistor or a resistor between components to be coupled.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
a first memory cell array;
a second memory cell array arranged above the first memory cell array in a first direction;
a third memory cell array arranged adjacent to the first memory cell array in a second direction intersecting with the first direction;
a fourth memory cell array arranged above the third memory cell array in the first direction and arranged adjacent to the second memory cell array in the second direction;
a first bit line coupled to the first memory cell array and the fourth memory cell array; and
a second bit line coupled to the second memory cell array and the third memory cell array.

2. The memory device of claim 1, further comprising:
a control chip comprising
a first sense amplifier coupled to the first memory cell array and the fourth memory cell array through the first bit line, and
a second sense amplifier coupled to the second memory cell array and the third memory cell array through the second bit line.

3. The memory device of claim 2,
wherein the first memory cell array is arranged above the first sense amplifier in the first direction, and
wherein the third memory cell array is arranged above the second sense amplifier in the first direction.

4. The memory device of claim 1,
wherein the first memory cell array includes a first memory cell coupled to a first word line,
wherein the second memory cell array includes a second memory cell coupled to the first word line,
wherein the third memory cell array includes a third memory cell coupled to a second word line, and
wherein the fourth memory cell array includes a fourth memory cell coupled to the second word line.

5. The memory device of claim 4,
wherein the first memory cell array includes a first semiconductor structure extending in the first direction, the first memory cell is formed on the first semiconductor structure, and the first semiconductor structure is coupled to the first bit line,
wherein the second memory cell array includes a second semiconductor structure extending in the first direction, the second memory cell is formed on the second semiconductor structure, and the second semiconductor structure is coupled to the second bit line,
wherein the third memory cell array includes a third semiconductor structure extending in the first direction, the third memory cell is formed on the third semiconductor structure, and the third semiconductor structure is coupled to the second bit line, and
wherein the fourth memory cell array includes a fourth semiconductor structure extending in the first direction, the fourth memory cell is formed on the fourth semi-conductor structure, and the fourth semiconductor structure coupled to the first bit line.

6. The memory device of claim 1, further comprising:
a first sense amplifier coupled to the first memory cell array and the fourth memory cell array through the first bit line, the first memory cell array being arranged above the first sense amplifier in the first direction; and
a second sense amplifier coupled to the second memory cell array and the third memory cell array through the second bit line, the third memory cell array being arranged above the second sense amplifier in the first direction.

7. The memory device of claim 1, further comprising:
a first memory chip comprising the first memory cell array and the third memory cell array; and
a second memory chip comprising the second memory cell array and the fourth memory cell array.

8. The memory device of claim 7, wherein the second memory chip comprises:
a first pad arranged on a surface of the second memory chip, the first pad being coupled to the fourth memory cell array through a portion of the first bit line, and
a second pad arranged on the surface of the second memory chip, the second pad being coupled to the second memory cell array through a portion of the second bit line, the second pad being closer to the fourth memory cell array than the second memory cell array, the first pad being closer to the second memory cell array than the fourth memory cell array.

9. The memory device of claim 8, wherein the first memory chip comprises:
a third pad arranged on a surface of the first memory chip, the third pad being coupled to the first pad, the third pad being coupled to the first memory cell array through another portion of the first bit line, and
a fourth pad arranged on the surface of the first memory chip, the fourth pad being coupled to the second pad, the fourth pad being coupled to the third memory cell array through another portion of the second bit line.

10. The memory device of claim 9,
wherein the third pad is closer to the first memory cell array than the third memory cell array, and
wherein the fourth pad is closer to the third memory cell array than the first memory cell array.

11. A memory device comprising:
a memory chip comprising:
a first memory cell array,
a second memory cell array arranged adjacent to the first memory cell array in a first direction,
a first pad arranged on a surface of the memory chip,
a second pad arranged on the surface of the memory chip, the second pad being closer to the second memory cell array than the first memory cell array, the first pad being closer to the first memory cell array than the second memory cell array,
a portion of a first bit line coupled to the first memory cell array and the second pad, and
a portion of a second bit line coupled to the second memory cell array and the first pad.

12. The memory device of claim 11, further comprising:
another memory chip arranged above the memory chip in a second direction intersecting with the first direction, the another memory chip comprising:
a third memory cell array,
a fourth memory cell array arranged adjacent to the third memory cell array in the first direction, a third pad arranged on a surface of the another memory chip, the third pad being coupled to the first pad,
a fourth pad arranged on the surface of the another memory chip, the fourth pad being coupled to the second pad,
another portion of the second bit line coupled to the third memory cell array and the third pad, and
another portion of the first bit line coupled to the fourth memory cell array and the fourth pad.

13. The memory device of claim 12,
wherein the third pad is closer to the third memory cell array than the fourth memory cell array, and
wherein the fourth pad is closer to the fourth memory cell array than the third memory cell array.

14. The memory device of claim 12,
wherein the third memory cell array is arranged above the first memory cell array in the second direction, and
wherein the fourth memory cell array is arranged above the second memory cell array in the second direction.

15. The memory device of claim 12, wherein the another memory chip comprises:
a fifth pad arranged on another surface of the another memory chip facing away from the surface of the another memory chip, the fifth pad being coupled to the another portion of the second bit line, and
a sixth pad arranged on the another surface of the another memory chip, the sixth pad being coupled to the another portion of the first bit line.

16. The memory device of claim 15, further comprising:
a circuit chip arranged above the another memory chip in the second direction, the circuit chip comprising:
a seventh pad arranged on a surface of the circuit chip, the seventh pad being coupled to the fifth pad,
an eighth pad arranged on the surface of the circuit chip, the eighth pad being coupled to the sixth pad,
a first sense amplifier coupled to the seventh pad, and
a second sense amplifier coupled to the eighth pad.

17. The memory device of claim 16,
wherein the first sense amplifier is arranged above the third memory cell array in the second direction, and
wherein the second sense amplifier is arranged above the fourth memory cell array in the second direction.

18. A memory device comprising:
a first memory cell array;
a second memory cell array arranged above the first memory cell array in a first direction;
a third memory cell array arranged adjacent to the first memory cell array in a second direction intersecting with the first direction;
a fourth memory cell array arranged above the third memory cell array in the first direction and arranged adjacent to the second memory cell array in the second direction;
a first sense amplifier coupled to the first memory cell array and the fourth memory cell array, the first memory cell array arranged above the first sense amplifier in the first direction; and
a second sense amplifier coupled to the second memory cell array and the third memory cell array, the third memory cell array being arranged above the second sense amplifier in the first direction.

19. The memory device of claim 18, further comprising:
a first word line coupled to a gate of a first memory cell of the first memory cell array and a gate of a second memory cell of the second memory cell array; and a second word line coupled to a gate of a third memory cell of the third memory cell array and a gate of a fourth memory cell of the fourth memory cell array.

20. The memory device of claim 19, wherein a voltage is applied to the first word line, while (i) the first sense amplifier performs an operation on the first memory cell of the first memory cell array through the first bit line and (ii) the second sense amplifier performs an operation on the second memory cell of the second memory cell array through the second bit line, and wherein the voltage is applied to the second word line, while (i) the first sense amplifier performs an operation on the fourth memory cell of the fourth memory cell array through the first bit line and (ii) the second sense amplifier performs an operation on the third memory cell of the third memory cell array through the second bit line.

\* \* \* \* \*